United States Patent [19]

Masuoka

[11] Patent Number: 5,475,608
[45] Date of Patent: Dec. 12, 1995

[54] SYSTEM FOR DESIGNING A PLACEMENT OF A PLACEMENT ELEMENT

[75] Inventor: Ryusuke Masuoka, Kawasaki, Japan

[73] Assignee: Fujitsu Limited, Kawasaki, Japan

[21] Appl. No.: 961,546

[22] Filed: Oct. 15, 1992

[30] Foreign Application Priority Data

Oct. 15, 1991 [JP] Japan ................... 3-0266105

[51] Int. Cl.$^6$ .................................... G06F 15/70
[52] U.S. Cl. .................. 364/491; 364/490; 364/489; 364/488
[58] Field of Search ................... 364/491, 489, 364/488, 490

[56] References Cited

U.S. PATENT DOCUMENTS

| | | | |
|---|---|---|---|
| 3,654,615 | 4/1972 | Freitag | 364/491 |
| 4,630,219 | 12/1986 | DiGiacomo et al. | 364/489 |
| 4,700,316 | 10/1987 | Nair | 364/488 |
| 4,700,317 | 10/1987 | Watanabe et al. | 364/488 |
| 4,918,614 | 4/1990 | Modarres et al. | 364/490 |
| 5,187,668 | 2/1993 | Okude et al. | 364/491 |
| 5,208,759 | 5/1993 | Wong | 364/491 |

FOREIGN PATENT DOCUMENTS 0388794 9/1990 European Pat. Off. .

OTHER PUBLICATIONS

"A Procedure for Placement of Standard–Cell VLSI Circuits" by Dunlop et al., IEEE Trans. on Computer–Aided Design, vol. CAD–4, No. 1, Jan. 1985, pp. 92–98.
"Automatic Placement–A Review of Current Techniques" by Preas et al., IEEE 23rd Design Automation Conference, Jun. 29–Jul. 2, 1986, pp. 622–629.
"Partitioning and Placement TEchnique for CMOS Gate Arrays" by Odawara et al., IEEE Trans. C.A.D., vol. CAD–6, No. 3, May 1987, pp. 355–363.
IEEE Transactions on Computer Aided Design of Integrated Circuits and Systems, vol. 9, No. 1, Jan. 1990, New York, "Smals: A Novel Database for Two–Dimensional Object Location", Sherer et al., pp. 57–65.
Software Engineering Journal, vol. 5, No. 6, Nov. 1990, London, GB, "Data Structures for Physical Representation of VLSI", Facanha, pp. 339–349.

*Primary Examiner*—Vincent N. Trans
*Attorney, Agent, or Firm*—Staas & Halsey

[57] ABSTRACT

A system for designing a placement of a placement element comprises a placement element storage unit for storing placement element data on placement elements, a placement set unit for setting a placement of the placement element and a placement output unit for outputting the result of setting the placement. The placement set unit comprises a unit area data storage unit, a plurality of intra-virtual-placement-area placement element position storage units, a pointer storage unit and a placement control unit. A unit area data storage unit stores unit area data on unit areas each for placing a placement element. An intra-virtual-placement-area placement element position storage unit stores placement element data on placement elements in virtual placement areas. A pointer storage unit specifies placement element data stored in the intra-virtual-placement-area placement element position storage unit to which the unit areas split from the placement area correspond. A placement control unit sets the placement of placement elements in the placement area such that the placement elements whose placement element data are stored in the virtual placement areas are placed in respective unit areas stored in the unit area data storage unit.

20 Claims, 20 Drawing Sheets

PLACEMENT AREA

CASE IN WHICH SINGLE
CELL PLACED OVER
PLURALITY OF UNIT AREAS
IS PLACED IN CELL AREAS
OF SINGLE LAYER

CASE IN WHICH SINGLE
CELL PLACED OVER
CELL AREAS IN
DIFFERENT LAYERS OVER
PLURALITY OF UNIT
AREAS IS PLACED

FIG. 9B  DEGREE OF REDUNDANCY FOR UNIT WIRE AREA (1, 1)

156

| LAYER NUMBER | WIRE NUMBER | DEGREE OF REDUNDANCY |
|---|---|---|
| 1 | 105 | 2 |
| 2 | 297 | 1 |
| 3 | | |

FIG. 9C  DEGREE OF REDUNDANCY FOR UNIT WIRE AREA (1, 3)

157

| LAYER NUMBER | WIRE NUMBER | DEGREE OF REDUNDANCY |
|---|---|---|
| 1 | 105 | 1 |
| 2 | 297 | 1 |
| 3 | | |

FIG. 11

| COORDINATE POSITION | BASIC CELL AND CELL NUMBER |
|---|---|
| (1, 1) | FIRST BC OF CELL NUMBER 37 |
| (1, 2) | NOTHING |
| ⋮ | ⋮ |
| (2, 1) | FIFTH BC OF CELL NUMBER 151 |
| (2, 2) | FOURTH BC OF CELL NUMBER 151 |
| ⋮ | ⋮ |
| (15, 27) | THIRD BC OF CELL NUMBER 71 AND SECOND BC OF CELL NUMBER 20 |
| ⋮ | ⋮ |

NORMAL DISTRIBUTION (x = 0, VARIANCE = 1)

ASYMETRICALLY CREATED PROBABILITY DISTRIBUTION

SYSTEM FOR DESIGNING A PLACEMENT OF A PLACEMENT ELEMENT

BACKGROUND OF THE INVENTION

1. Field of the Invention

This invention pertains to a system for designing a placement of a part in general, and more particularly to a system for designing a placement of a placement element, e.g., a cell, a terminal or a wire, in an integrated circuit, a printed circuit board or the like.

2. Description of the Related Arts

Placement elements, such as cells, terminals and wires in an integrated circuit, a printed circuit board or the like need to be placed, such that cells are integrated as highly as possible with the lowest possible routing cost.

A placement of placement elements has been determined by a comparison of the probability of a current placement with that of a new placement, in which routing costs based on the wire lengths or energies calculated by a simulated annealing method determine the probabilities.

Because a placement designing system such as that described above takes an increasing amount of time when placement elements increase in number, a faster system has been sought, as integrated circuits and printed circuit boards become more densely packaged.

The following are definitions of terms used in a forthcoming description.

A placement element: A placement element is an object to be placed in an integrated circuit, a printed circuit board or the like. Placement elements such as cells, terminals connected to a cell and wires are placed in an integrated circuit. Placement elements such as a placed cell and a via hole, which actually take up a part of a placement area, are placed in a printed circuit. A cell is defined as a single placement unit such as a single processor or a logic gate unit.

A placement area: A placement area is an area for placing placement elements, and is structured by placement element data on a placement element placed in an area, which are stored in a storage unit. A placement area is outputted, e.g., to a display as a printed circuit board or an integrated circuit board in which placement elements are placed.

A unit area: A unit area is obtained by splitting a placement area through an assignment of data (e.g., a unit area number) for specifying the unit area. For example, a unit area for a cell is ordinarily a basic cell (hereafter abbreviated as a BC), which is a form unit of a cell in a gate array, and a unit area for a wire is ordinarily a grid unit, where a grid is defined as the smallest unit of a VLSI (very large scale integrated circuit). One [1] cell may comprise a plurality of unit cells.

A virtual placement area: A virtual placement area for virtually placing a placement element is assigned to each type of a placement element in correspondence with data (e.g., a unit area number) for specifying a unit area for placing a placement element. The virtual placement area is structured by a storage unit for storing, e.g. attributes of a placement element, a proper name and a unit area number for making a placement. When a placement element is a cell, a terminal, a wire, or a via hole, a virtual placement area is called a cell area, a terminal area, a wire area or a via hole area.

A conventional placement designing system is such that a cell has data, e.g., on the position of a placement area when the placement of a circuit element of an integrated circuit is designed and that a terminal and a wire respectively have terminal data on connecting cells and wire data, thereby obtaining a placement of a cell and a wire connected to a cell.

FIG. 1 shows a conventional placement designing system. In FIG. 1:

1 is a pointer storage unit for storing a pointer to placement element data (e.g., cell data, terminal data or wire data) on each type of placement element;

2 is a placement storage unit for storing placement element data (e.g., cell data, terminal data or wire data) on each type of placement element; and

3 is a placement area storage unit.

3' is a unit area split from a placement area in BC units, where each BC has a coordinate position expressed: e.g., in an x-y coordinate value;

4 is cell data on a cell having a cell number 1, which represents a placement element such as a logic gate in an integrated circuit;

5 is cell data on a cell having a cell number 2, which represents a placement element such as a logic gate in an integrated circuit;

6 is terminal data on a terminal having a terminal number A1, which connects the cell having cell number 1 to a wire having a wire number 1;

7 is terminal data on a terminal having a terminal number A2, which connects the cell having cell number 1 to a wire having a wire number 2;

8 is terminal data on a terminal having a terminal number A3, which connects the cell having cell number 2 to the wire having wire number 2 and a wire having a wire number 3;

9 is terminal data on a terminal having a terminal number A4, which connects the cell having cell number 2 to the wire having a wire number 3;

10 is wire data on the wire having wire number 1;

11 is wire data on the wire having wire number 2; and

12 is wire data on the wire having wire number 3.

Conventionally, the placement storage unit 2 has data storage areas respectively for cell data 4 (on the cell having cell number 1), cell data 5 (on the cell having cell number 2), terminal data 6 (on the cell having terminal number A1), terminal data 7 (on the terminal having terminal number A2), terminal data 8 (on the terminal having terminal number A3), terminal data 9 (on the terminal having terminal number A4), wire data 10 (on the wire having wire number 1), wire data 11 (on the wire having wire number 2) and wire data 12 (on the wire having wire number 3). Pointer storage unit 1 comprises pointers to data of respective placement elements.

The contents of the placement storage unit 2 and the placement area storage unit 3 are explained more concretely below. The placement area storage unit 3 stores coordinate positions of respective unit areas split from a placement area and characteristics of the unit areas, for example, a prohibition on a cell placement in a unit area. The placement storage unit 2, on the other hand, stores concrete data, e.g., on a cell and a terminal. For instance, the placement storage unit 2 stores the coordinate position of a unit area for placing a cell and the cell number of a cell connected to a terminal.

FIG. 2 shows a data structure of a conventional placement designing system.

More specifically, FIG. 2 shows an example of a placement and routing of a gate array. In FIG. 2:

13 is data representing a process of a gate array;

14 is a pointer to a placement element;

15 is what stores global data such as a temperature and dimensions of a placement area in an integrated circuit;

16 (corresponding to 1 shown in FIG. 1) is a pointer storage unit for storing pointers to data on respective placement elements, such as a pointer to cell data, a pointer to terminal data and a pointer to wire data;

17 is a cell area for storing in a sequence of cell numbers cell data such as coordinate positions of the unit areas at which cells (e.g. cell 4 (having cell number 1) and cell 5 (having cell number 2) shown in FIG. 1) are placed;

18 is a terminal area for storing in a sequence of terminal numbers terminal data such as cell numbers of cells to which terminals (e.g. terminal 6 (having terminal number A1), terminal 7 (having terminal number A2), terminal 8 (having terminal number A3), and terminal 9 (having terminal number A4) shown in FIG. 1) are connected and coordinate positions of unit areas at which the terminals are placed; and 19 is a wire area for storing in a sequence of wire numbers wire data such as terminal numbers of terminals to which wires (e.g. wire 10 (having wire number 1), wire 11 (having wire number 2) and wire 12 (having wire number 3)) are connected and coordinate positions of the unit areas at which wires are placed.

The temperature and dimensions of a placement area in an integrated circuit referred to here as global data are parameters for use in calculating routing costs based on the wire lengths or energies according to a simulated annealing method, which will be described later.

FIG. 1 looks as if the pointer to cell data points to cell 4 (having cell number 1) only and the pointer to terminal data points to terminal 6 (having terminal number A1) only. However, a pointer to cell data actually points to the head end of a cell area (e.g., a cell area 17 shown in FIG. 2) for storing cell data sequentially.

That is, the placement storage unit 2 shown in FIG. 1 is equivalent to a combination of the cell area 17, the terminal area 18 and the wire area 19 shown in FIG. 2.

Conventionally, a pointer to cell data specifies storage areas of data on respective cells and a pointer to terminal data specifies storage areas of data on respective terminals according to the data structure shown in FIG. 2. Based on the data in the storage areas specified by these pointers, a placement has been designed by placing cells at specified coordinate positions, by obtaining a cell connected to a terminal and by connecting a terminal to a specified cell.

A conventional placement designing system is explained below by using the coordinate positions of respective unit areas shown in FIG. 1.

Firstly, the pointer storage unit 1 specifies the pointer to cell data or the pointer to terminal data.

Secondly, according to the pointer to cell data, the pointer storage unit 1 sequentially specifies cell numbers 1, 2, etc., and writes into the cell area 17 cell data such as the coordinate positions (i.e. (1, 3) for cell 4 (having cell number 1) and (1, 4) for cell 5 (having cell number 2)) of the unit areas in the placement area at which cells 4 and 5 are placed.

Thirdly, according to the pointer to terminal data, the pointer storage unit 1 sequentially specifies cell numbers A1, A2, A3, A4, etc., and writes into the terminal area 18 terminal data such as the cell numbers (i.e. 1 for terminal 6 (having terminal number A1), 1 for terminal 7 (having terminal number A2), 2 for terminal 8 (having terminal number A3) and 2 for terminal 9 (having terminal number A4)) of the cells to which the terminals 6 through 9 are connected.

Fourthly, according to the pointer to wire data, the pointer storage unit 1 sequentially specifies wire numbers 1, 2, 3, etc., and writes into the wire area 19 wire data such as the terminal numbers (i.e., A1 for wire 10 (having wire number 1), A2 and A3 for wire 11 (having wire number 2) and A3 and A4 for wire 12 (having wire number 3)) of the terminals to which the wires 10, 11 and 12 are connected.

As well, although a placement area of an integrated circuit and a wire area of a printed circuit board may carry placement element data, the placement element data are limited, e.g., to data on cell dimensions, which do not include concrete data on a terminal or a wire between terminals.

More specifically, the placement element data were limited only to such data as on the number of cells classified by their dimensions placed in respective split areas.

FIG. 3 shows a method for changing a placement based on a conventional simulated annealing method.

A conventional placement change method is explained below according to the numbers shown in FIG. 3.

(1) New coordinate positions are created stochastically for placement elements such as a cell and a terminal. A random number, for example, is used for determining the new coordinate positions with a creation probability being uniform throughout a placement area.

(2) An energy difference before and after a placement change is calculated, where an energy is determined, e.g., by a wire length.

(3) By comparing the energy difference, an index as a benchmark for determining whether or not to move to a new coordinate position is created.

(4) An arbitrary number is generated as a random number, which is compared with the index calculated in (3), for determining whether or not to move to a new coordinate position. On positively determining a move to a new coordinate position, a placement is made at the new coordinate position. On negatively determining a move to a new coordinate position, a placement at a current coordinate position is maintained.

(1) through (4) are repeated until an optimal placement is obtained in (5) through a satisfaction of a terminating condition, thereby obtaining an optimal placement.

(5) The terminating condition is, for example, any one of (a) repetition a predetermined number of times, (b) a repetition until reaching less than a predetermined energy, and (c) a repetition until an energy reduction volume is less than a predetermined energy E at the end of N times where N is a predetermined number.

A conventional placement designing system stores placement elements in a sequence of cell numbers and in a sequence of terminal numbers, in which a cell has a coordinate position of a placement area (a position for placing a unit area), a terminal has a cell number of a cell for placing the terminal, and a wire has a terminal number to which the wire is connected. When a cell undergoes a placement change, after all cells are sequentially accessed for changing connection data (e.g., on a change of a cell coordinate value, a terminal connected to a cell and a wire connection), the cells and terminals are sequentially accessed for obtaining new placement data. Hence, a conventional placement designing system takes a large amount of time for processing a placement change. Also, because of the data structure, since the coordinate positions must be searched in the sequence of cell numbers and in the sequence of terminal numbers for a conversion to a new coordinate position in a placement change, the conventional method for designing a placement and a routing is not fit for a parallel computer incorporating a multiprocessor system.

Problems in changing a cell placement are explained in further detail below.

When a cell placement is changed, a critical point is that the changed cell has an overlap with another cell. To examine a cell overlap, there is a need to check, for each cell, whether a coordinate position after a cell movement is the same as a coordinate position before a cell movement.

When a cell is moved, terminal data need to be updated because the position of a terminal connected to the cell may be changed. When a cell does not have terminal data but instead a terminal has cell data as shown in FIGS. 1 and 2, all terminal data must be accessed for searching for a terminal connected to a cell.

When, for example, a position of the cell having cell number 1 is changed, a new coordinate position must be given to the cell having cell number 1. To examine whether a cell already exists at the new coordinate position, it must be checked whether the new coordinate position of the cell having cell number 1 is equal to the coordinate position of the cell having cell number 2 by accessing cell data on the cell having cell number 2. To search for all the terminals connected to the cell having cell number 1, it needs to be checked whether or not respective terminals (having terminal numbers A1, A2, A3 and A4) are connected to the cell having cell number 1 by accessing terminal data on these terminals (having terminal numbers A1, A2, A3 and A4). Accordingly, the processing for a change in a cell placement tends to require a greater amount of time.

When a placement element such as a cell corresponds with a placement area, a cell can have few data, which makes it difficult, if not impossible, to determine a placement satisfying a strict constraint (e.g., that a single cell is placed over a plurality of unit areas) dependent on a cell shape necessary in an actual placement or to evaluate the obtained placement under a strict constraint.

Also, conventionally, because the probability of creating a new coordinate value for changing a placement is uniform throughout a placement area, a movement destination is created unconditionally irrespective of cell characteristics. Hence, not only is efficiency low, but also processing takes too much time.

SUMMARY OF THE INVENTION

This invention pertains to a system for designing a placement/routing of a placement element for expediting design processes.

A feature of this invention resides in a system for designing a placement/routing, in which a placement/routing unit 21 comprises a unit area data storage unit 31 for storing unit area data on a unit area, split from an area, for placing a placement element in, a plurality of intra-virtual-placement-area element position storage units (38, 39) each for storing the position of a virtual placement area, defined for each type of a placement element placed virtually, at which a placement element is positioned, and a pointer unit 33, provided in correspondence with the unit area data, for specifying a placement element stored in the intra-virtual-placement-area placement element position storage units (38, 39) to which the unit area data correspond, where the pointer unit 33 establishes a correspondence between a unit area stored in the unit area data storage unit 31 and a placement element stored in the intra-virtual-placement-area placement element position storage units (38, 39) in making a placement and a routing.

BRIEF DESCRIPTION OF THE DRAWINGS

One of skill in the art can easily understand additional features and objects of this invention from the description of the preferred embodiments and some of the attached drawings. In the drawings:

FIGS. 9A–9C show an explanatory chart illustrating a degree of redundancy in this invention;

FIG. 11 is an explanatory chart of the contents of data whose structure is shown in FIG. 10;

DESCRIPTION OF THE PREFERRED EMBODIMENTS

This invention aims at providing a placement designing system expediting the design process with easy application to a parallel computer.

According to this invention, virtual placement areas for virtually placing placement elements, such as a cell and a terminal, are set in a storage unit for respective types of placement elements. Pointers specify virtual areas of placement elements placed in respective unit areas of a placement area, for obtaining placement elements placed in respective unit areas based on placement element data on respective placement elements in virtual placement areas, thereby obtaining placement element data on a placement area.

Here, the word "virtual" used in a phrase "virtual placement area" should be construed first as meaning a check of an optimal placement of placement elements placed virtually and second as meaning an allowance of a cell overlap by a multilayer structure of virtual areas (described later) during an intermediate state of design even though cells cannot be stacked up for a placement in a printed circuit board.

Figure 4:
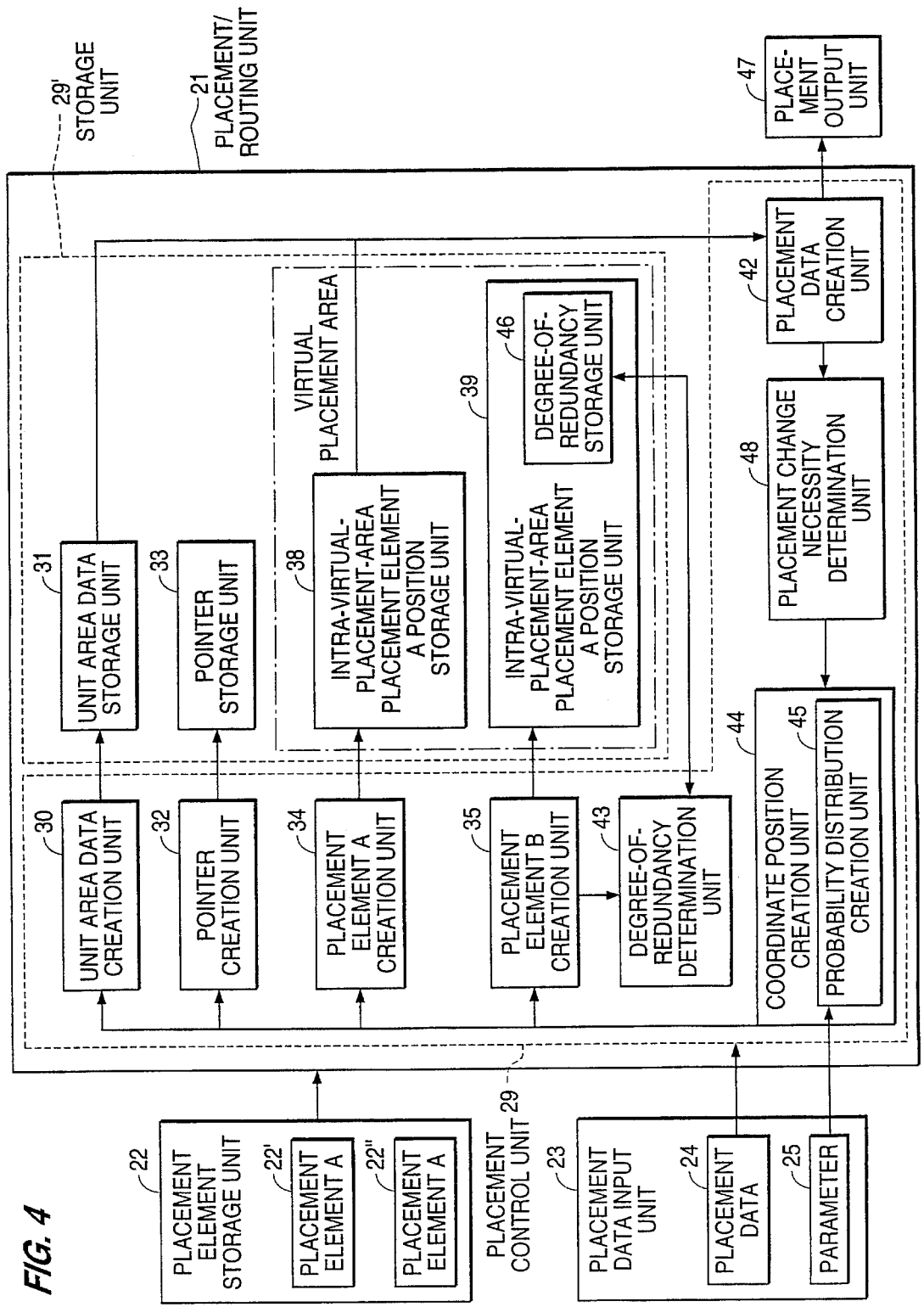
FIG. 4 is a block diagram of this invention.

FIG. 4 is a block diagram of this invention.

In FIG. 4:

21 is a placement/routing unit, which may comprise a central processing unit of a computer and a main memory, an external memory device or the like, for placing placement elements;

22 is a placement element storage unit, which may comprise a memory device inside of a computer or an external memory device such as a disk file apparatus, for storing placement elements (a cell, a wire, etc.);

22' is data on a placement element A;

22" is data on a placement element B;

23 is a placement data input unit for inputting placement data defining a wire placement condition such as wire data of a circuit, which may comprise what inputs placement data stored in a magnetic medium such as a magnetic tape and a disk apparatus, or an input unit such as a keyboard;

24 is placement data inputted by the placement data input unit 23;

25 is a parameter inputted by the placement data input unit 23, expressing a parameter (such as a temperature when a placement is performed by a simulated annealing method (to be described later)) necessary for creating a coordinate position by a coordinate position creation unit 44 (described later);

29 is a placement control which may comprise an operations program for executing respective processes developed on a central processing unit and a main memory, for controlling a creation of placement data. 29' is a storage unit, such as a main memory and an external memory, for storing placement element data on placement elements in virtual placement areas and on unit areas;

30 is a unit area data creation unit for creating a placement area, for dividing the placement area into unit areas, for assigning coordinate positions and for setting the unit areas in a unit area data storage unit 31;

31 is a unit area data storage unit for storing unit areas created by the unit area data creation unit 30;

32 is a pointer creation unit for creating pointers for specifying placement elements in virtual placement areas for respective unit areas;

33 is a pointer storage unit for storing pointers specifying placement elements in respective unit areas;

34 and 35 are a placement element A creation unit and a placement element B creation unit, respectively, for creating in respective virtual storage areas, data (e.g., on a position in placement areas in which placement element A and placement element B are placed) according to the placement data 24, data on respective placement elements and coordinate positions created by the coordinate position creation unit 44 (described later);

38 and 39 are an intra-virtual-placement-area placement element A position storage unit and an intra-virtual-placement-area placement element B position storage unit, respectively, for storing, e.g., position data on placement in placement areas of placement elements A and B created respectively by the placement element A creation unit 34 and the placement element B creation unit 35.

(The reason why the two [2] types (i.e., A and B) of placement elements are distinguished is because different types of placement elements, such as a cell, a terminal, a wire and a via hole, need to be distinguished. Of these placement elements, B represents those placement elements that must account for their degrees of redundancy.)

42 is a placement data creation unit for outputting placement data on respective placement elements in a placement area, based on virtual placement data of respective placement elements stored in intra-virtual-placement-area placement element A position storage unit 38 and intra-virtual-placement-area placement element B position storage unit 39 and placement area data stored in the unit area data storage unit 31;

43 is a degree-of-redundancy determination unit for determining a degree of redundancy, e.g., when same wires are redundantly placed in a same unit area, and for recording the degree of redundancy in a wire area of a corresponding virtual placement area;

44 is a coordinate creation unit for creating a coordinate position for placing a placement element;

45 is a probability distribution creation unit for the coordinate position creation unit 44 for creating a probability distribution such that a coordinate position after a creation is made in accordance with a probability distribution from a coordinate position before a creation;

46 is a degree-of-redundancy storage area for storing the degree of redundancy determined by the degree-of-redundancy determination unit 43;

47 is a placement output unit for outputting to a display or a printer placement data created by placement data creation unit 42 or an actual placement image; and

48 is a placement change necessity determination unit for determining whether to change a placement according to the placement created by the placement data creation unit 42 or to keep a placement at a current coordinate position.

Figure 5:
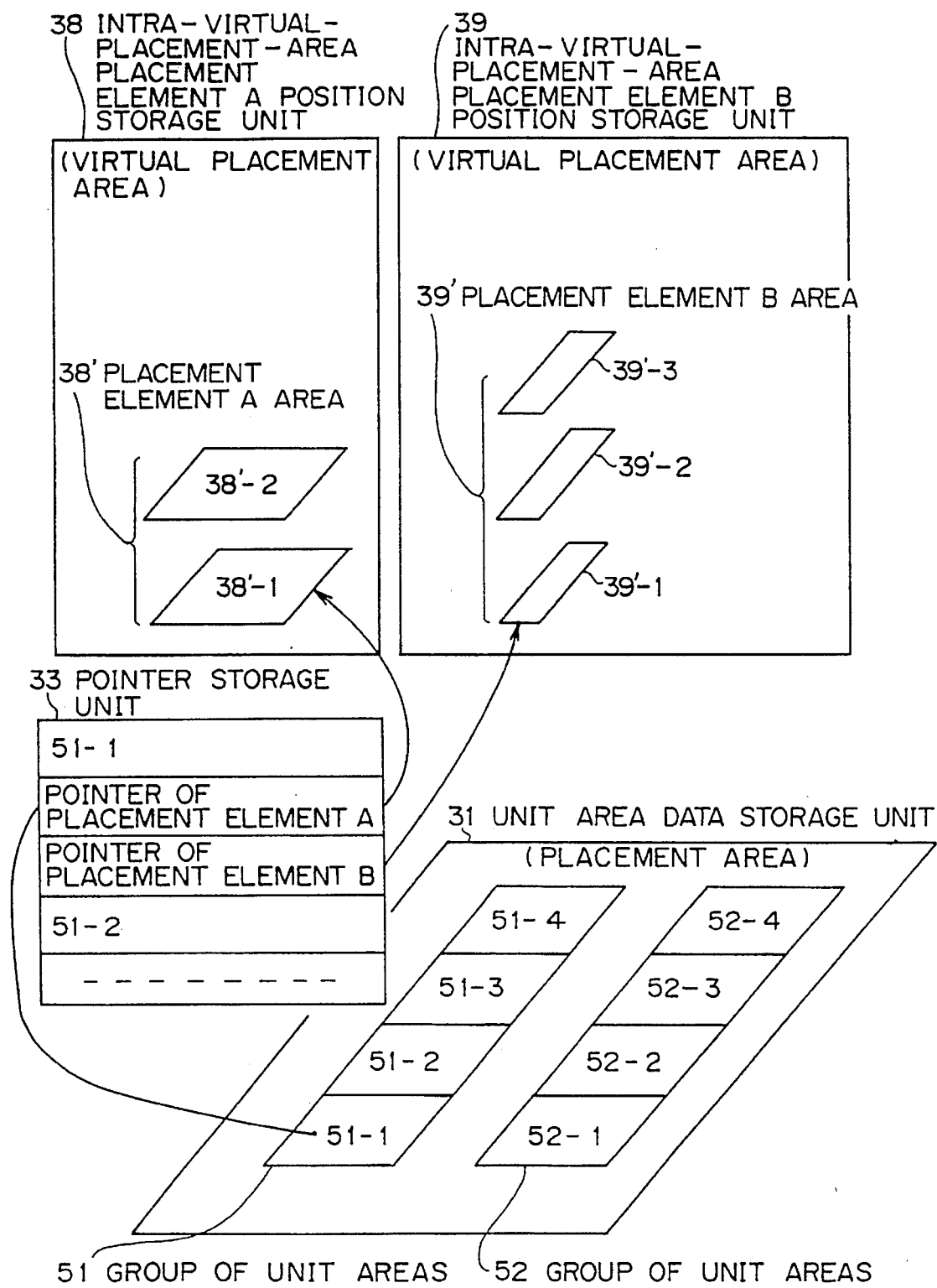
FIG. 5 is a conceptual view of a placement area and a virtual placement area of this invention.

FIG. 5 is a conceptual view of a placement area and a virtual placement area of this invention.

Before describing the operations of the basic configuration shown in FIG. 4, the concepts of a placement area and a virtual placement area of this invention are explained by FIG. 5.

51 and 52 are groups of unit areas stored in the unit area data storage unit 31 respectively expressing coordinate positions of unit areas 51-1 through 51-4 and 52-1 through 52-4. The intra-virtual-placement-area placement element A position storage unit 38 is for storing, for example, position data on placement of placement element A in a placement area.

The intra-virtual-placement-area placement element A position storage unit 38 has one [1] or more layers of virtual placement areas. 38' is a virtual placement area of placement element A. 38'-1 is a storage area in a first layer corresponding to unit area 51-1. 38'-2 is a storage area in a second layer corresponding to unit area 51-1.

The intra-virtual-placement-area placement element B position storage unit 39 has one [1] or more layers of virtual placement areas. 39' is a virtual placement area of placement element B. 39'-1 is a storage area in a first layer corresponding to unit area 51-1. 39'-2 is a storage area in a second layer corresponding to unit area 51-1. 39'-3 is a storage area in a third layer corresponding to unit area 51-1. The pointer storage unit 33 stores pointers to placement element data, stored in the virtual placement areas 38' and 39', on placement elements placed in respective unit areas.

The unit area data storage unit 31 stores unit area data for specifying a pointer to data in a virtual placement area regarding a placement element currently placed in each unit area. More specifically, the unit area data storage unit 31 has the pointer storage unit 33 store in unit area 51-1 data on pointers to placement element A and placement element B.

The pointer to placement element A specifies storage area 38'-1 (in the virtual placement area of placement element A 38') for storing data for specifying data on placement element A to be placed in unit area 51-1, e.g., a cell number when placement element A is a cell.

The virtual placement area of placement element A 38' and the virtual placement area of placement element B 39' have multilayer structures.

For instance, the reason why the virtual placement area of placement element A 38' comprises two [2] storage areas 38'-1 and 38'-2 is because two [2] cells may be stacked up in unit area 51-1 during a course of designing.

More specifically, unless the virtual placement area of placement element A 38' has the plural storage areas 38'-1 and 38'-2, a cell may be moved only to a unit area where no cell is currently placed. Especially, when a cell is large, it becomes impossible to change its position once being fixed.

Having a plurality of virtual placement areas, other cells may be moved to a unit area for placing another cell. Also, it becomes possible to move the cell originally placed in the unit area to a different unit area.

Operations under the basic structure shown in FIG. 5 are explained by referring to FIG. 5 (and FIG. 4).

The placement/routing unit 21 reads and receives data on placement element A and placement element B from the placement element storage unit 22, and receives placement data and a parameter from the placement data input unit 23.

This invention aims at obtaining a more desirable placement by changing placements a number of times. Hence, an initial placement is necessary for initiating a placement change, which must be generated one way or another, e.g., randomly.

The unit area data creation unit 30 splits the groups of unit areas 51 and 52 in a placement area into unit areas 51-1 through 51-4 and 52-1 through 52-4 by assigning coordinate positions to them.

The placement element A creation unit 34 and the placement element B creation unit 35 respectively create data on placement element A and placement element B in correspondence with respective virtual placement areas, based on placement data 24. For example, when both placement element A and placement element B are placed in unit area 51-1, placement element A is placed virtually in storage area 38'-1 of virtual placement area 38' in the intra-virtual-placement-area placement element A position storage unit 38 in unit area 51-1. Likewise, placement element B is placed virtually in storage area 39'-1 of virtual placement area 39' in the intra-virtual-placement-area placement element B position storage unit 39 in unit area 51-1.

Concurrently, in correspondence with the number expressing a position of a unit area, the pointer creation unit 32 creates a pointer to data on a placement element placed in the unit area for a storage in a pointer unit 33.

The placement data creation unit 42 obtains, from virtual placements of respective placement elements specified by pointer storage unit 33 in respective unit areas, the types and numbers of placement elements placed in respective unit areas for creating placement data in the unit area data storage unit 30. For instance, according to the pointer of pointer storage unit 33 to placement element A in unit area 51-1, the placement data creation unit 22 obtains virtual placement data on placement element A in storage area 38'-1 of unit area 51-1. Similarly, according to the pointer of pointer storage unit 33 to placement element B in unit area 51-1, the placement data creation unit 42 obtains virtual placement data on placement element B in storage area 39'-1 of unit area 51-1. Then, the placement data creation unit 22 creates placement data on placement element A and placement element B placed in unit area 51-1. The placement data creation unit 42 thus creates placement data for all unit areas for an output to the placement output unit 47.

The placement output unit 47 comprises a display, for instance, for displaying a unit area in correspondence with data stored in the unit area data storage unit 31 in a grid image on a screen and for outputting images of placement element A and placement element B placed in unit area 51-1.

The placement change necessity determination unit 48 receives the placement data created by the placement data creation unit 42 and stochastically determines whether to change the placement of a placement element based on a newly created placement or to keep the current placement. The placement change necessity determination unit 48 calculates a routing cost or a routing energy (described later) for the wire length based on the new placement. The placement change necessity determination unit 48 creates an index for stochastically determining the necessity for a placement change based on the routing cost or the routing energy. Then, a random number is generated for determining the placement change through a comparison with the index. (For instance, placement elements are placed differently if a generated number is less than the index, and are kept "as is" otherwise.) On positively determining an execution of a placement change, the placement change necessity determination unit 48 changes the placement of a placement element according to the new placement. On negatively determining an execution of a placement change, the placement change necessity determination unit 48 keeps the old placement. Then, the placement change necessity determination unit 48 instructs the coordinate position creation unit 44 to create a next coordinate position.

On receiving an instruction from the placement change necessity determination unit 48, the coordinate position creation unit 44 generates a different coordinate position. Respective data creation units (the placement element A creation unit 34, the placement element B creation unit 35, the unit area data creation unit 30 and the pointer creation unit 32) create placement data for placement element A and placement element B for storage in the intra-virtual-placement-area placement element A position storage unit 38, the intra-virtual-placement-area placement element B position storage unit 39, the unit area data storage unit 31 and pointer storage unit 33. Thereafter, according to the earlier described process, the new placement data are created.

This invention is such that a coordinate position creation by the coordinate position creation unit 44 is not without regard to the coordinate position before the coordinate position creation, but instead such that a coordinate position correlated to the coordinate position before the coordinate position creation is generated according to the probability distribution created by the probability distribution creation unit 45, thereby minimizing meaningless placement changes.

Also, when placement element B is a wire, for instance, same wires may be placed redundantly in a same unit area of a placement area. This invention is such that the degree-of-redundancy determination unit 43 determines such a degree of redundancy and expresses the placement/routing by recording the degree-of-redundancy. Therefore, multiple layers of same wires cannot be placed in a virtual placement area in correspondence with a same coordinate position.

An input to the degree-of-redundancy determination unit 43 is an output from a placement element creation unit (e.g., the placement element B creation means 35 shown in FIG. 4) requiring a determination of a degree of redundancy. The degree-of-redundancy storage area 46 stores an output from the degree-of-redundancy determination unit 43.

The intra-virtual-placement-area placement element B position storage unit 39 contains data stored in the degree-of-redundancy storage area 46, which becomes an input to the placement data creation unit 42.

As described above, this invention is such that the unit area data storage unit 31 stores a pointer to a virtual placement area storing placement element data on a placement element to be placed in each unit area. For instance, when a cell in unit area 51-1 is to be moved, to examine whether or not another cell has already been placed in unit area 51-1, storage areas 38'-1 and 38'-2 in placement element A area 38' of the virtual placement area in intra-virtual-placement-area placement element (A) storage unit 38 need only be accessed in correspondence with the cell. Because this sheds the necessity for accessing all cell data as in the prior art, the processing time can be reduced significantly.

Although FIG. 4 shows a structure in which the unit area data storage unit 31, the intra-virtual-placement-area placement element A position storage unit 38 and the intra-virtual-placement-area placement element B position storage unit 39 are all different, these may be realized in different storage areas of the same storage unit in an actual computer.

Figure 6:
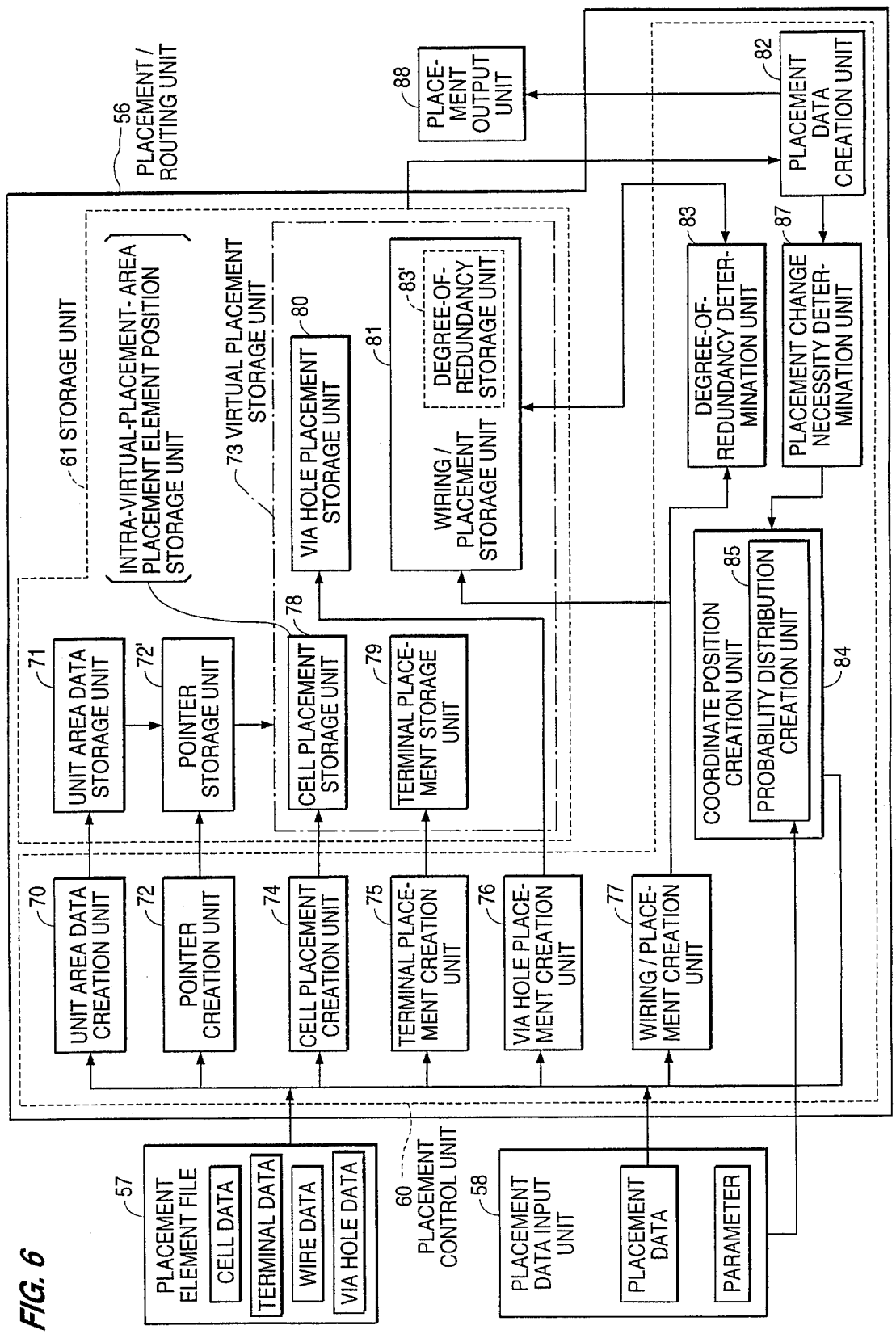
FIG. 6 is a block diagram showing a structure of an embodiment of this invention.

FIG. 6 is a block diagram showing a structure of an embodiment of this invention.

More specifically, FIG. 6 shows a structure when a placement of circuit elements in an integrated circuit board or a printed circuit board is designed.

In FIG. 6:

56 is a placement/routing unit;

57 is a placement element file for storing cell data, terminal data, wire data and via hole data;

58 is a placement data input unit, e.g., for inputting placement data and a parameter, e.g., comprising a magnetic tape device, a magnetic disk device or a keyboard;

60 is a placement control unit;

61 is a storage unit;

70 is a unit area data creation unit;

71 is a unit area data storage unit;

72 is a pointer creation unit;

72' is a pointer storage unit;

73 is a virtual placement storage unit;

74 is a cell placement creation unit for creating data on placing a cell placed on an integrated circuit board or a printed circuit board;

75 is a terminal placement creation unit for creating data on placing a terminal;

76 is a via hole placement creation unit for creating data on placing a via hole;

77 is a wire placement creation unit for creating data on placing a wire;

78 (equivalent to one of the intra-virtual-placement-area placement element A position storage unit 38 and the intra-virtual-placement-area placement element B position storage unit 39 shown in FIG. 4) is a cell placement storage unit for storing cell placement data created in the cell placement creation unit 74;

79 (equivalent to one of the intra-virtual-placement-area placement element A position storage unit 38 and the intra-virtual-placement-area placement element B position storage unit 39 shown in FIG. 4) is a terminal placement storage unit for storing terminal placement data created by the terminal placement data creation unit 75;

80 (equivalent to one of the intra-virtual-placement-area placement element A position storage unit 38 and the intra-virtual-placement-area placement element B position storage unit 39 shown in FIG. 4) is a via hole placement storage unit for storing via hole data created by the via hole creation unit 76;

81 (equivalent to one of the intra-virtual-placement-area placement element A position storage unit 38 and the intra-virtual-placement-area placement element B position storage unit 39 shown in FIG. 4) is a wire placement storage unit for storing wire placement data created by the wire placement creation unit 77;

83 is a degree-of-redundancy determination unit,

84 is a coordinate position creation unit;

85 is a probability distribution creation unit;

87 is a placement change necessity determination unit; and

88 is a placement output unit.

Figure 7:
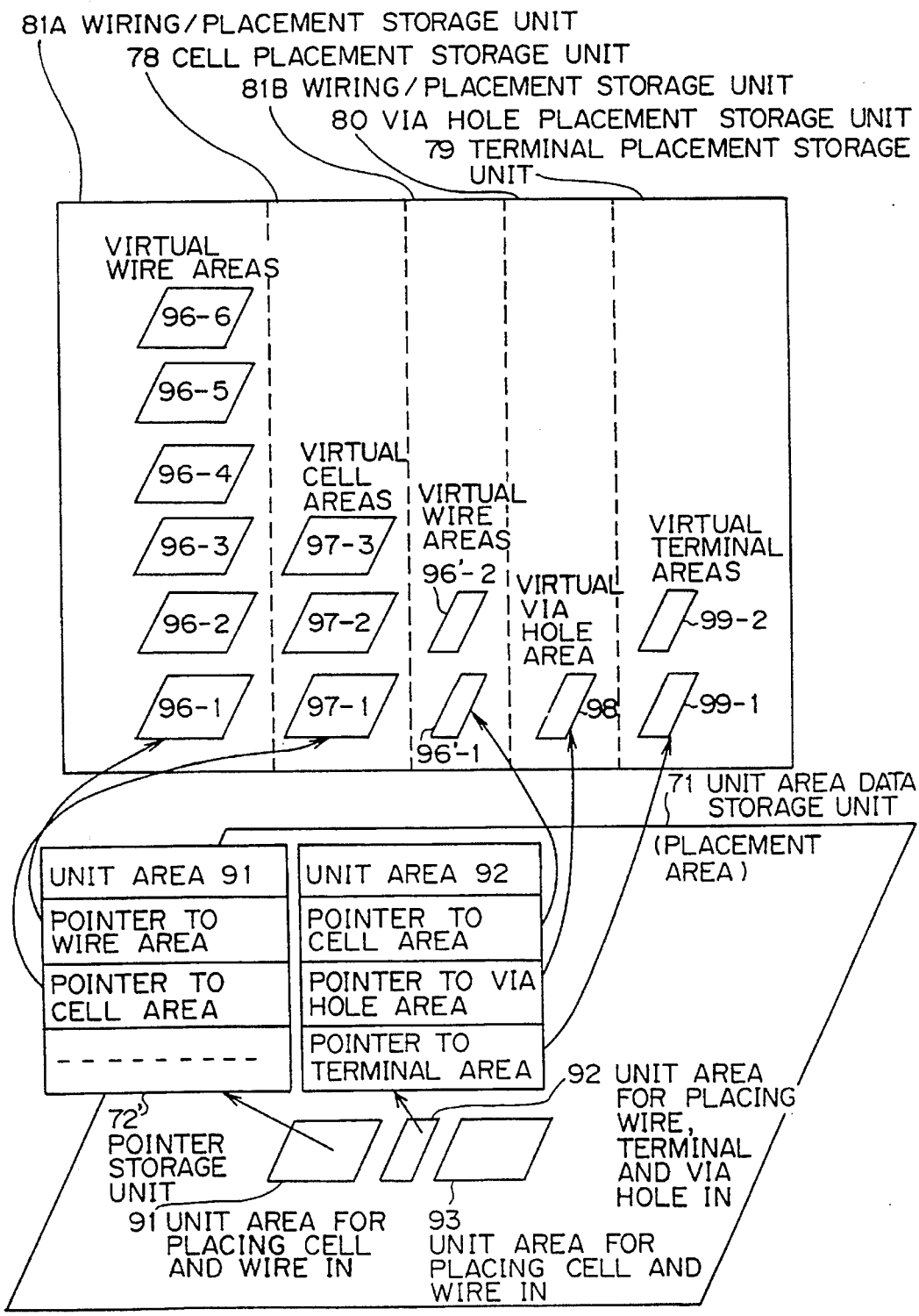
FIG. 7 is a conceptual view of an embodiment of a placement designing system of this invention.

FIG. 7 is a conceptual view of an embodiment of a placement designing system of this invention.

FIG. 7 illustrates the operations of an embodiment shown in FIG. 6.

In FIG. 7:

81A and 81B (equivalent to the intra-virtual-placement-area placement element A position storage unit 38 and the intra-virtual-placement-area placement element B position storage unit 39 shown in FIG. 4) are wire placement storage units for storing wire placement data created by the wire placement creation unit 77;

91 and 93 are unit areas in a placement area for placing a cell or a wire;

92 is a unit area for placing a wire, a terminal, or a via hole;

96-1 through 96-6, 96'-1 and 96'-2 are virtual wire areas for virtually placing wires, of which 96-1 and 96'-1 are in a first layer, 96-2 and 96'-2 are in a second layer, 96-3, 96-4, 96-5 and 96-6 are respectively in third, fourth, fifth and sixth layers;

96-1 through 96-6 are virtual wire areas for virtually placing wires, which correspond to unit area 91;

96'-1 and 96'-2 are virtual wire areas for virtually placing wires, which correspond to unit area 92;

97-1, 97-2 and 97-3 are virtual cell areas for virtually placing cells respectively in first, second and third layers, each expressing a virtual placement of a cell, which correspond to unit area 91;

98 is a virtual via hole area for virtually placing a via hole, which corresponds to unit area 92;

99-1 and 99-2 are virtual terminal areas for virtually placing in terminals, which correspond to unit area 92 respectively in first and second layers.

The wire placement storage units 81A and 81B are provided separately in association with the actual designing of an integrated circuit. Because only a designated area in a board is available for placing a cell, the rest (wire placement storage unit 81B) is available for placing a wire (i.e., routing a wire) but not available for placing a cell. Of the designated area in the board, a part not used for placing a cell (wire placement storage unit 81A) is available for placing a wire (i.e., routing a wire).

The operations of this embodiment having the structure shown in FIG. 6 are explained by referring to FIG. 7.

The placement/routing unit 56 reads from the placement element file 57 cell data, such as cell names and cell dimensions, terminal data, such as terminal names and terminal dimensions, wire data, such as wire names and wire widths, and via hole data. The placement/routing unit 56 also receives circuit wire data from the placement data input unit 58.

Here, wire data in the placement element file 57 are data on wire attributes, such as the width of a single wire, whereas wire data in the placement data input unit 58 are concrete data on individual routing paths, such as the wire number in a particular unit area.

The unit area data creation unit 70 creates a placement area, which it splits into unit areas (91, 92 and 93 shown in FIG. 7) by assigning unit area numbers, and the unit area data storage unit 71 stores the coordinate positions of respective unit areas.

The coordinate position creation unit 84 receives from the placement data input unit 58 placement data and a parameter. The probability distribution creation unit 85 creates placement data for virtually placing placement elements based on placement data and a cell coordinate position, and sets a coordinate position for placing a cell, based on the probability distribution (number of the unit area for placing a cell). For instance, when a coordinate position of a cell is changed, the coordinate position creation unit 84 receives, as placement data, the original coordinate position of the cell.

The cell placement creation unit 74 creates placement data, for virtually placing a cell based on the created coordinate position, for a storage in the cell placement storage unit 78.

The terminal placement creation unit 75, the via hole placement creation unit 76 and the wire placement creation unit 77 create placement data, for virtually placing respective placement elements based on the placement data and the cell coordinate positions, for a storage respectively in the terminal placement storage unit 79, the via hole placement storage unit 80 and the wire placement storage unit 81.

The pointer creation unit 72 creates pointers, for specifying virtual placement areas of placement elements placed in respective unit areas, for a storage in pointer storage unit 72'.

The placement data creation unit 82 creates placement data by obtaining a placement element placed in respective unit areas from placement data on the placement element in a virtual placement area, which is specified by a pointer according to pointer storage unit 72'. That is, the placement data creation unit 82 obtains placement element data to be placed in each unit area, and converts the placement data into a format acceptable to the placement output unit 88.

The placement output unit 88 receives placement data outputted from the placement data creation unit 82, and displays an obtained placement (a cell placement, a terminal connected with a cell, a wire connecting between terminals and between via holes) in an actual placement image on a display.

Further, the placement change necessity determination unit 87 inputs placement data created by the placement data creation unit 82 for determining whether to set the obtained placement as a new placement or to keep the current placement. The method for determining the necessity of a placement change will be described later.

Degree-of-redundancy determination unit 83 counts the degrees of redundancy when same wires are placed in a same unit area, and records the degrees of redundancy in the virtual wire areas for virtually placing wires (e.g., 96-1 through 96-6, 96'-1 and 96'-2 shown in FIG. 7) which correspond to the unit area. This is for preventing same wires from being stacked up in multiple layers in a virtual placement area.

Figure 8A:
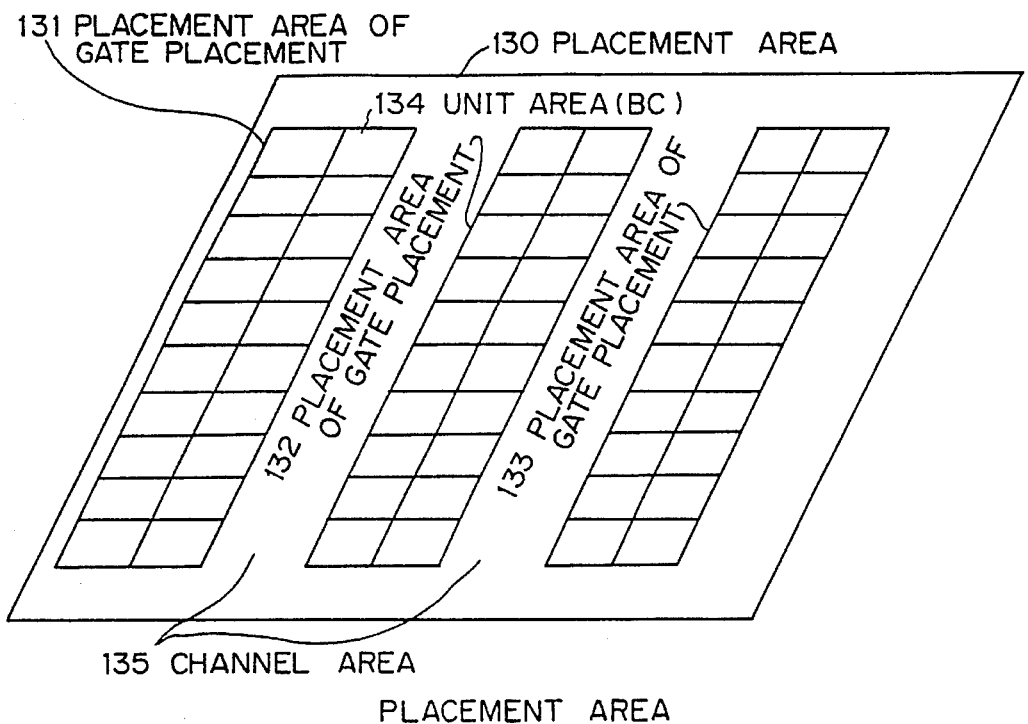
FIGS. 8A–8C show a conceptual view of a cell area and a unit area in an embodiment of this invention.
Figure 8B:
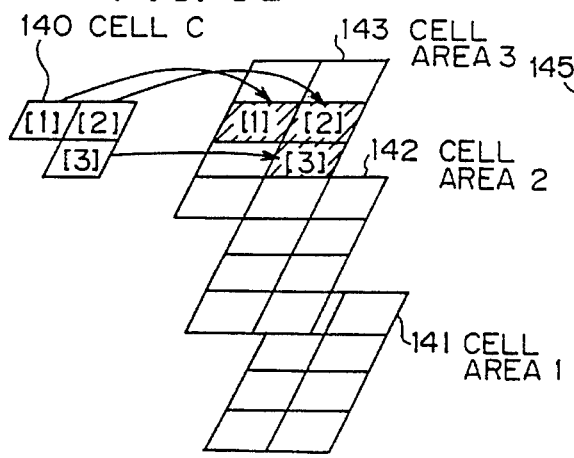

FIGS. 8A–8B show a conceptual view of a cell area and a unit area in an embodiment of this invention.

The cell area corresponds to the virtual cell areas 97-1, 97-2 and 97-3 shown in FIG. 7.

FIG. 8A shows a placement area when a gate array is placed.

130 is a placement area, 131, 132 and 133 are placement areas of gate arrays, and 134 is a unit area (BC). FIG. 8A shows a case in which a unit area is a basic cell, which is a cell unit of a gate array. 135 is a channel area, which is between placement area 131 of a gate array and placement area 132 of a gate array and between placement area 132 of a gate array and placement area 133 of a gate array. The channel area 135 corresponds to unit area 92 shown in FIG. 7. (Although this is not shown, a channel area is also split into unit areas.)

FIG. 8B shows a case in which a single cell placed over a plurality of unit areas is placed in cell areas of a single layer.

In FIG. 8B, 140 is cell C positioned on three [3] unit areas. Parts [1], [2] and [3] placed in unit areas indicate the relative positions. 141, 142 and 143 are cell area 1, cell area 2 and cell area 3, respectively.

Because the coordinate positions for virtually placing cell C (140) in are not free in cell area 1 and cell area 2, a case is shown in which cell C (140) is virtually placed in cell area 3. As shown in section (b), cell C (140) is placed in unit areas by a split into [1], [2] and [3] indicating the relative positions.

Figure 8C:
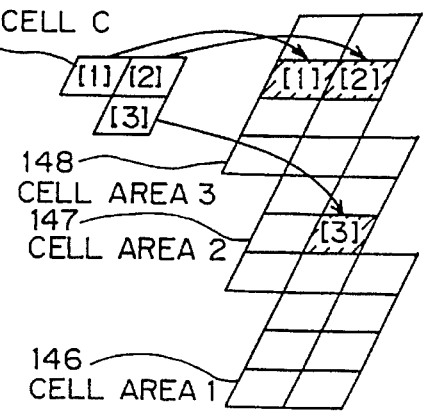

FIG. 8C shows a case in which a single cell placed over a plurality of unit areas is placed over cell areas in different layers.

FIG. 8C, 145 is cell C placed over three [3] unit areas. Parts [1], [2] and [3] placed in unit areas indicate the relative positions. 146, 147 and 148 are cell area 1, cell area 2 and cell area 3, respectively.

Because the coordinate positions for virtually placing parts [1] and [2] of cell C (145) in are not free in cell area 1 and cell area 2, parts [1] and [2] of cell C (145) are virtually placed in cell area 3, as shown in section (c). Also, since cell area 1 is not free, but cell area 2 (147) is free, as a position for placing [3] of cell C (145) in, part [3] of cell C (145) is virtually placed in cell area 2 (147).

Figure 9A:
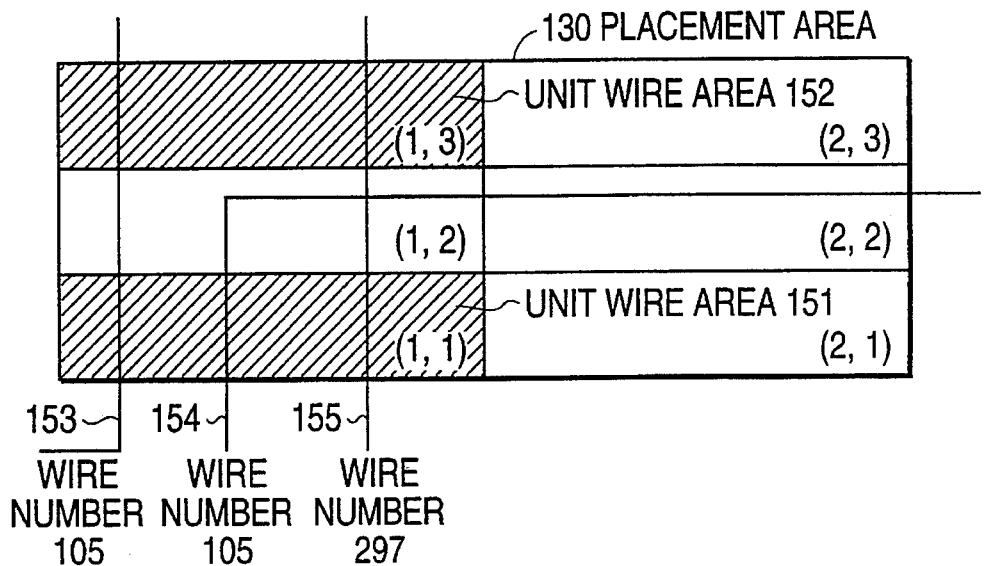

FIGS. 9A–9C show an explanatory chart illustrating a degree of redundancy of this invention.

In FIG. 9A, 151 is a unit wire area (corresponding to one of the unit areas 91, 92 and 93 shown in FIG. 7) whose coordinate position is (1, 1). 152 is a unit wire area whose coordinate position is (1, 3). 153, 154 and 155 are wires, having wire numbers 105, 105 and 297. In FIG. 9B, 156 is the degree of redundancy in a unit wire area (1, 1). In FIG.

9C, 157 is a degree of redundancy in a unit wire area (1, 3).

In placing a wire, there is a case in which wires of a same type (wires having a same wire number) are placed in a same unit area. When such wires are placed virtually in virtual placement areas, a virtual placement area in a single layer records a degree of redundancy in wires, instead of placing the wires in multiple layers.

As shown in FIG. 9B, when a wire number 105 and a wire number 297 are wired, because two [2] of wire number 105 are placed in a virtual placement area corresponding to unit wire area (1, 1), a layer number 1 records wire number 105 and a degree of redundancy 2. Then, because a wire number 297 is placed in unit wire area 1 of coordinate position (1, 1), layer number 2 records wire number 297 in degree of redundancy 1.

Similarly, since a unit wire area of coordinate position (1, 3) has one [1] wire each of wire number 105 and wire number 297, as shown in FIG. 9C, layer number 1 records wire number 105 in degree of redundancy 1, and layer number 2 records wire number 297 in degree of redundancy 2.

Figure 10:
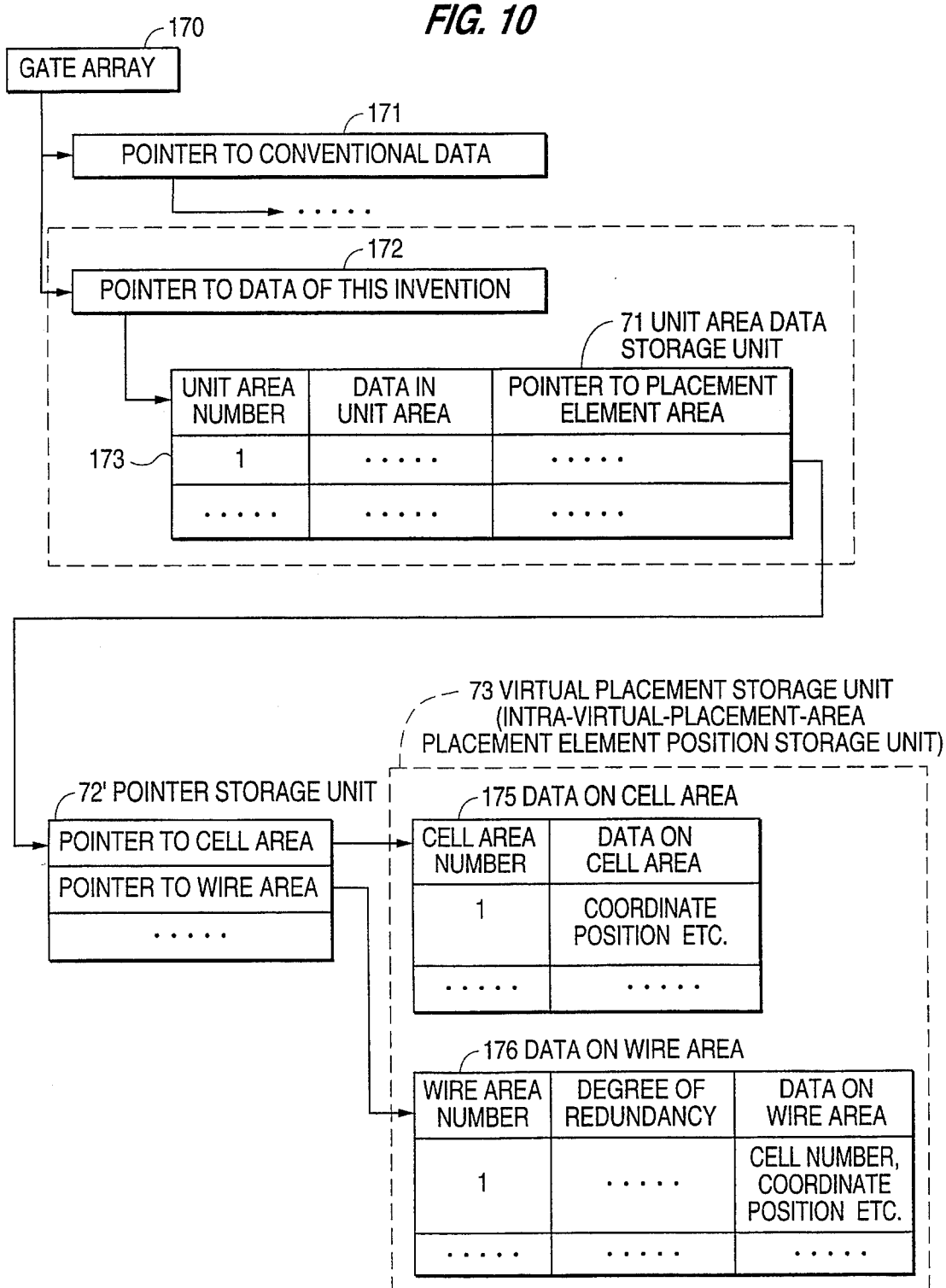
FIG. 10 is a diagram illustrating a data structure in an embodiment of this invention.

FIG. 10 is a diagram illustrating a data structure in an embodiment of this invention.

It shows a case in which a gate array is placed in a data structure where a conventional placement method and a placement method of this invention are mixed. Since the data structure of the conventional placement method is the same as that shown in FIG. 2, their structure is not shown here.

In FIG. 10:

71 is a unit area data storage unit;

73 is a virtual placement storage unit (intra-virtual-placement-area placement element position storage unit);

170 is data indicating placement wire data of a gate array;

171 is a pointer to conventional data (such as cell data in the placement element file 57 shown in FIG. 6) according to a conventional placement/routing method;

172 is a pointer to data according to a placement/routing method of this invention;

173 is a pointer to storage areas of respective placement elements having correspondences with unit areas;

72' is a pointer storage unit for expressing a pointer to a storage area (a cell area, a wire area, etc.) of virtual placement data on a placement element;

175 is data on a cell area, which is for storing a unit area number (coordinate position) for placing in a cell in correspondence with each cell number; and 176 is data on a wire area for storing a degree of redundancy and a coordinate position in correspondence with the number of a wire area.

A data structure of this invention is such that the unit area data storage unit 71 has a pointer to each placement element specified by a pointer in each unit area specify a placement element placed in each unit area. As such, the pointer storage unit 72' has a content for specifying combinations between virtual placements of a cell, a terminal and a wire each placed in unit areas and unit areas respectively for placing a cell, for placing a terminal connected to a cell, and for placing a wire connecting terminals.

The data structure shown in FIG. 10 is explained in further detail. First, pointers 173 in the unit area data storage unit 71 comprise, for all unit areas, a pointer to a unit area number (e.g., 1), a pointer to unit area data (e.g., data on whether unit area 1 can be placed), and a pointer to a placement element area. The unit area to which a pointer to a cell area points has data on the cell number of a cell placed in unit area 1. Then, the unit area to which a pointer to a wire area points has data on the wire number of a wire placed in unit area 1.

FIG. 11 is an explanatory chart of the contents of data whose structure is shown in FIG. 10.

According to this invention, in correspondence with respective unit areas in the unit area data storage unit 71, the virtual placement storage unit 73 stores concrete data on a placement element (e.g., a cell) to be placed in the unit areas. The coordinate values indicate the positions of the unit areas. For instance, the intra-virtual-placement-area data for the unit area whose coordinate value is (1, 1) indicate "placing a first BC (basic cell) in the cell whose cell number is 37". Also, because the intra-virtual-placement-area data for the unit area whose coordinate value is (15, 27) indicate allowance for placing plural cells temporarily, the corresponding virtual area has a plurality of layers.

Figure 1:
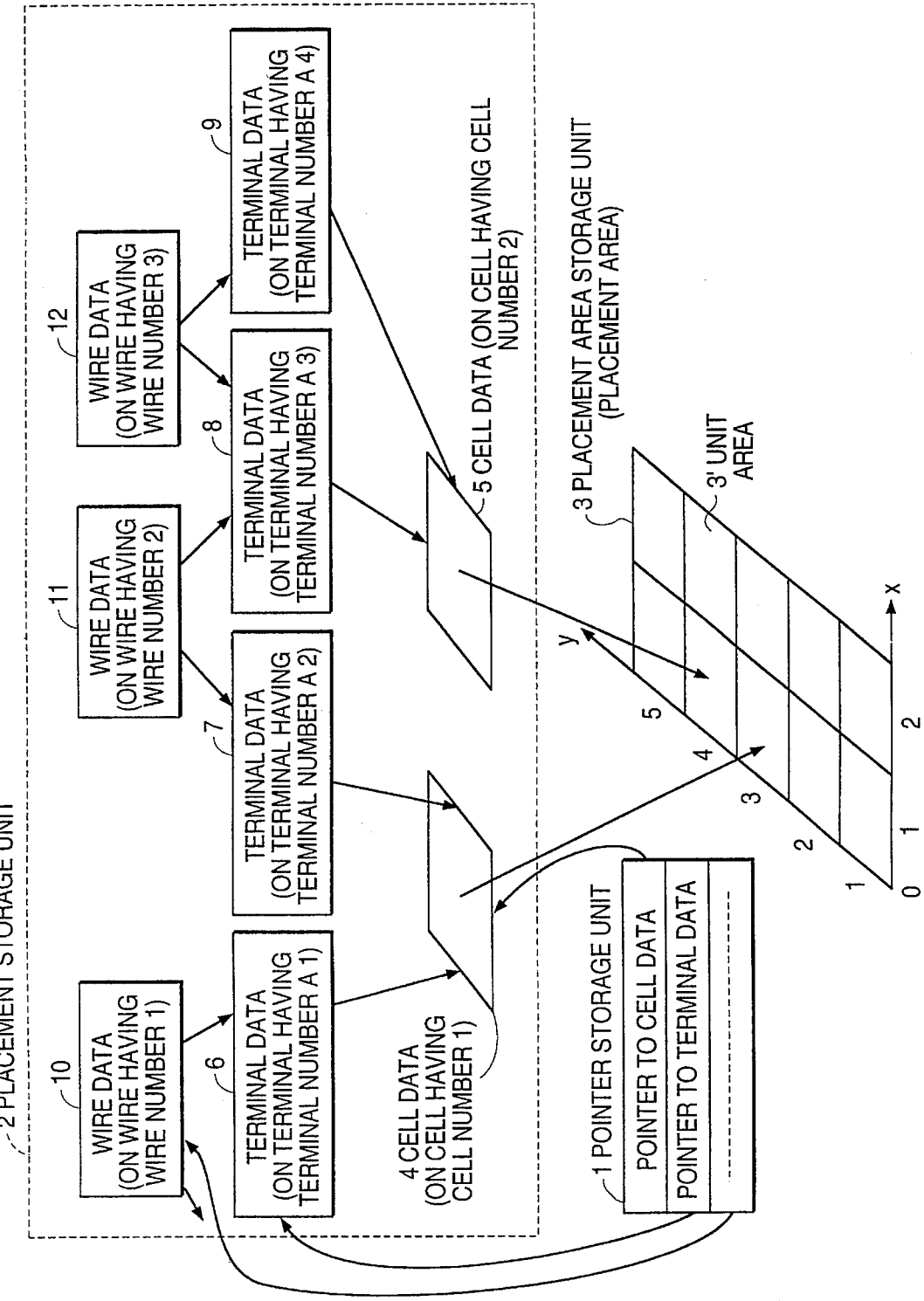
FIG. 1 shows a conventional placement/routing designing system.
Figure 2:
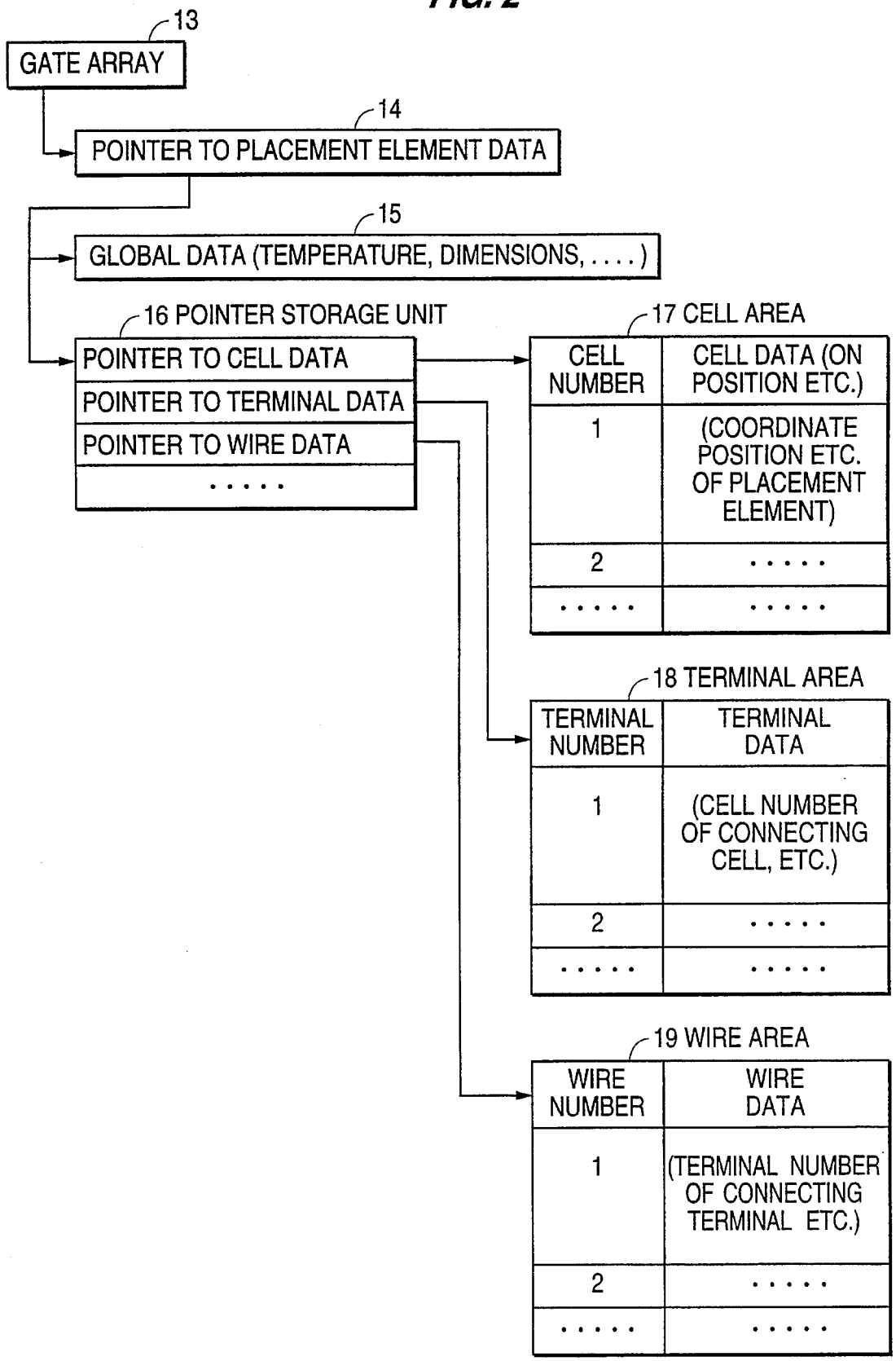
FIG. 2 shows a data structure of a conventional placement/routing designing system.

On the other hand, according to the conventional system shown in FIG. 2, because, for instance, the cell area 17 for a cell stores a coordinate position for placing a cell in correspondence with a cell number as described earlier, when a cell is placed in a particular position, the placement positions of all cells need to be examined for checking the possibility of placing a new cell.

Figure 12:
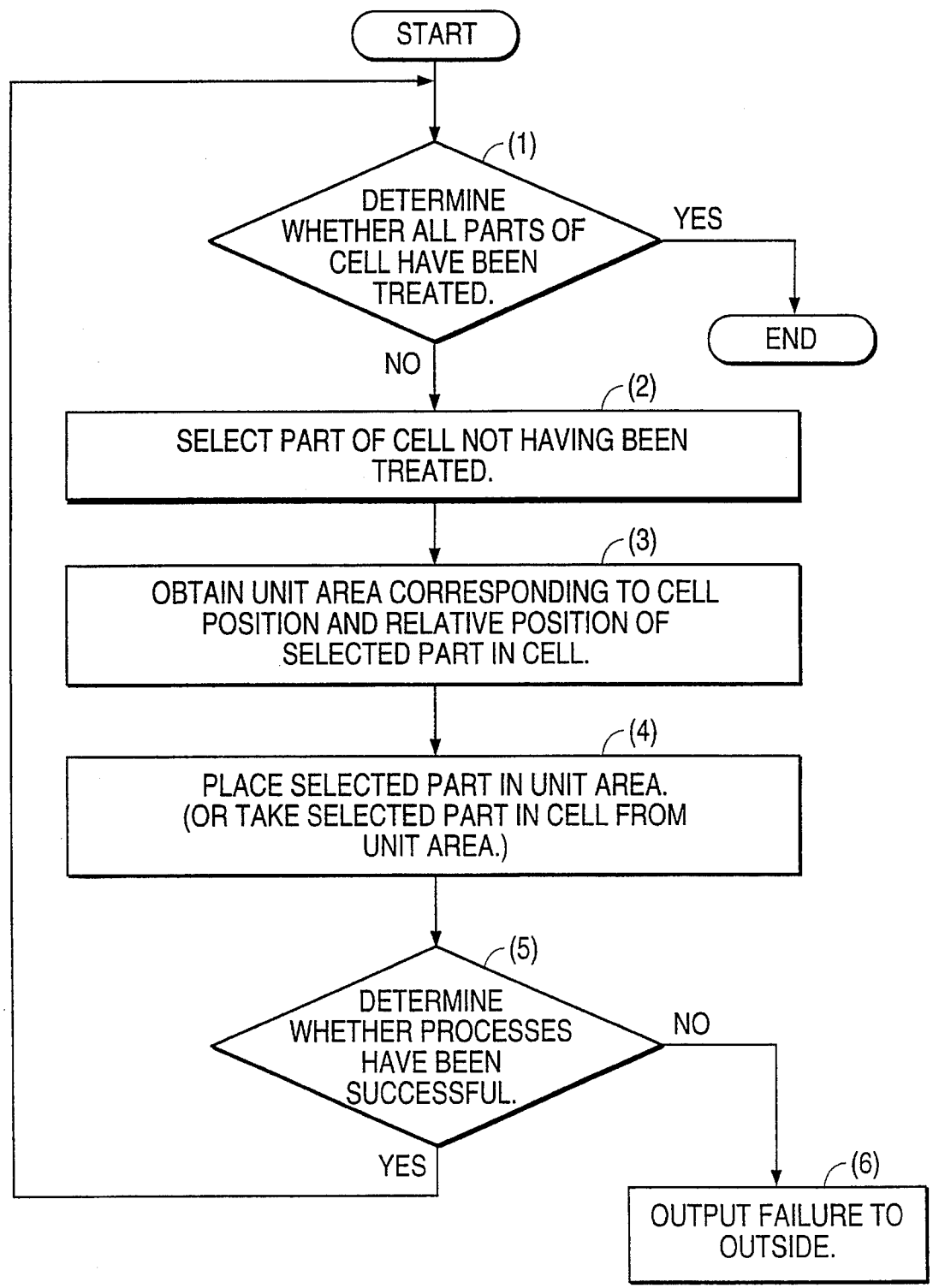
FIG. 12 shows an algorithm for placing a cell by a cell area creation unit.

FIG. 12 shows an algorithm for placing a cell.

The cell placement creation unit 74 shown in FIG. 6 executes this algorithm.

(1) Determine whether all parts (e.g., three [3] parts [1], [2] and [3] of cell C shown in FIG. 8) of a cell have been treated completely. Upon completion, processes end. Otherwise, proceed to (2).

(2) Select a part of the cell not having been treated.

(3) Obtain a unit area corresponding to a cell position and a relative position (relative positions of respective parts in a cell when the cell is placed over a plurality of unit areas) of the selected part in the cell.

(4) In case of a placement, place a selected part in a unit area. More specifically, the cell placement memory unit 78 shown in FIG. 7 has its cell area store data on the selected part, and the pointer storage unit 72' sets a pointer thereto. In case of an elimination, eliminate a selected part from a unit area in a cell.

(5) Determine whether processes have been successful. If the processes have been successful, return to (1), thereby repeating processes after (1). If the processes are not successful, output the result to the outside. If a position desired for placing a cell prohibits a placement of a cell, the processing is determined to be a failure.

Figure 13:
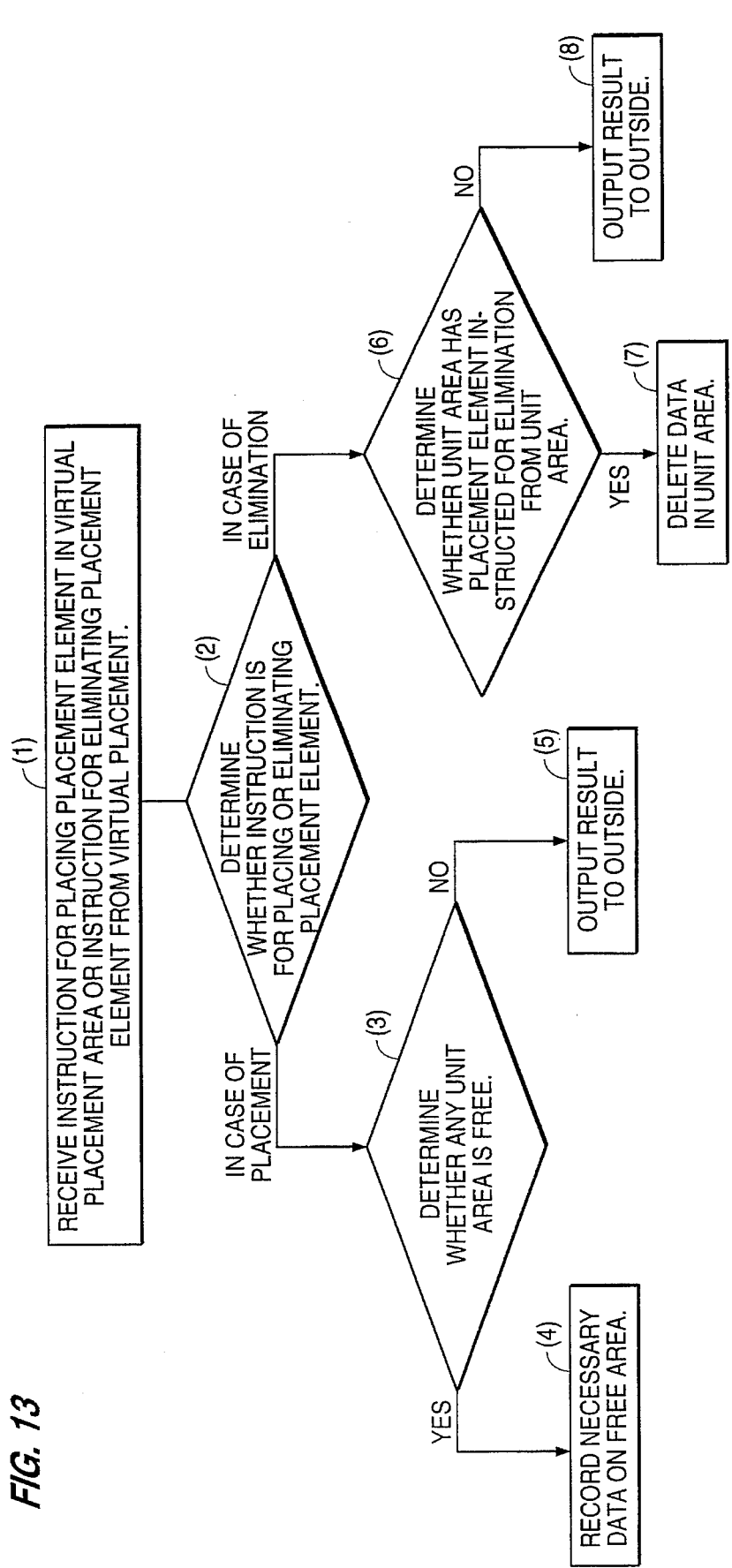
FIG. 13 shows an embodiment of an algorithm for changing a placement when there is no redundancy.

FIG. 13 shows an embodiment of an algorithm for a placement change when there is no redundancy.

The cell placement creation unit 74, the terminal placement creation unit 75 and the via hole placement creation unit 76 execute this algorithm. The algorithm is explained below according to numbers shown in FIG. 9.

(1) Receive an instruction for placing a placement element in a virtual placement area or an instruction for eliminating a placement element from a virtual placement area.

(2) Determine whether an instruction is for placing or eliminating from a placement element. Proceed to (3) in case of a placement, and proceed to (8) in case of an elimination.

(3) In case of a placement, determine whether a unit area desired for placing the placement element in is free. If there is a free area, proceed to (4). If there is no free area, skip to (5). In making a determination in (3), the types of placement elements need to be considered, e.g., when unit area 91 shown in FIG. 7 can place both a cell and a wire contemporaneously.

(4) Record necessary data in a free area, if a unit area or a corresponding virtual storage area is free.

(5) Output the result to the outside, if no free area is available.

(6) Determine whether a placement element matches one instructed for an elimination from a unit area of the placement element, on determining in (2) that the instruction is for eliminating a placement element. If both match proceed to (7), otherwise skip to (8).

(7) Delete data in unit areas of a placement element.

(8) Output to the outside a message informing of a mismatch with an instructed placement element.

Figure 14:
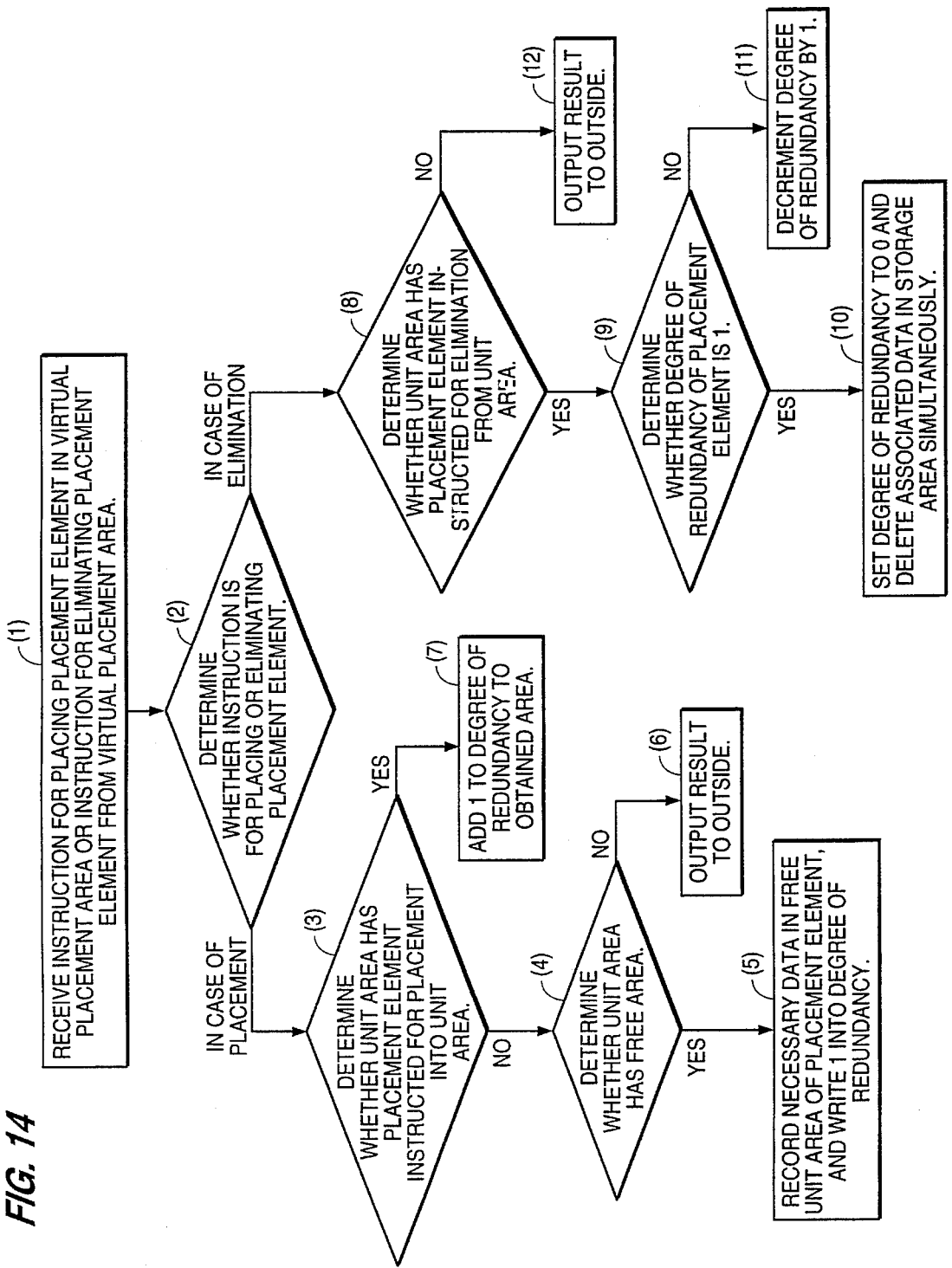
FIG. 14 shows an embodiment of an algorithm for changing a placement when there is a redundancy.

FIG. 14 shows an embodiment of an algorithm for a placement change when there is a redundancy.

The wire placement creation unit 77 executes this algorithm. The algorithm is explained below according to numbers shown in FIG. 14.

(1) Receive an instruction for placing a placement element in a virtual placement area or an instruction for eliminating a placement element from a virtual placement area.

(2) Determine whether an instruction is for placing or eliminating a placement element. Proceed to (3) in case of an instruction for a placement, and skip to (8) in case of an instruction for an elimination.

(3) In case of a placement, determine whether a unit area desired for placing the placement element has one matching a placement element, according to the contents of the virtual placement areas corresponding to respective unit areas. If there is none matching the placement element, proceed to (4). If there is a one matching the placement element, skip to (7).

(4) Determine whether a unit area desired for placing the placement element has a free area.

(5) Record necessary data, e.g., in a free unit area, and write 1 as a degree of redundancy in the corresponding virtual area.

(6) If none of the unit areas is determined to be free in (4), output the result to the outside.

(7) Increment by one [1] the degree of redundancy in the unit area determined in (3).

(8) Determine whether a placement element matches one instructed for elimination from a unit area, on determining that the instruction is for eliminating a placement element in (2). If both match proceed to (9), otherwise skip to (12).

(9) Determine whether or not the degree of redundancy in the area corresponding to the placement element is one [1]. If it is one [1], proceed to (10). If it is not one [1], proceed to (11).

(10) When the degree of redundancy in the area corresponding to the placement element is one [1], set the degree of redundancy to zero [0] and delete associated data in the virtual placement area simultaneously.

(11) If the degree of redundancy is not one [1], decrement the degree of redundancy by one [1].

(12) If it is determined in (8) the placement element placed in a unit area does not match a placement element, output the result to the outside.

In the algorithm shown in FIGS. 13 and 14, it is important to be able to examine whether or not a placement element can be placed in a designated unit area.

In other words, it is of critical importance to check whether (an identical type of) placement element is placed in a new position to which a placement element is moved. This is due to such constraints as that more than one [1] cell cannot be placed at an identical position in designing an actual integrated circuit and that the volume of wires placed in an area is limited.

Figure 15A:
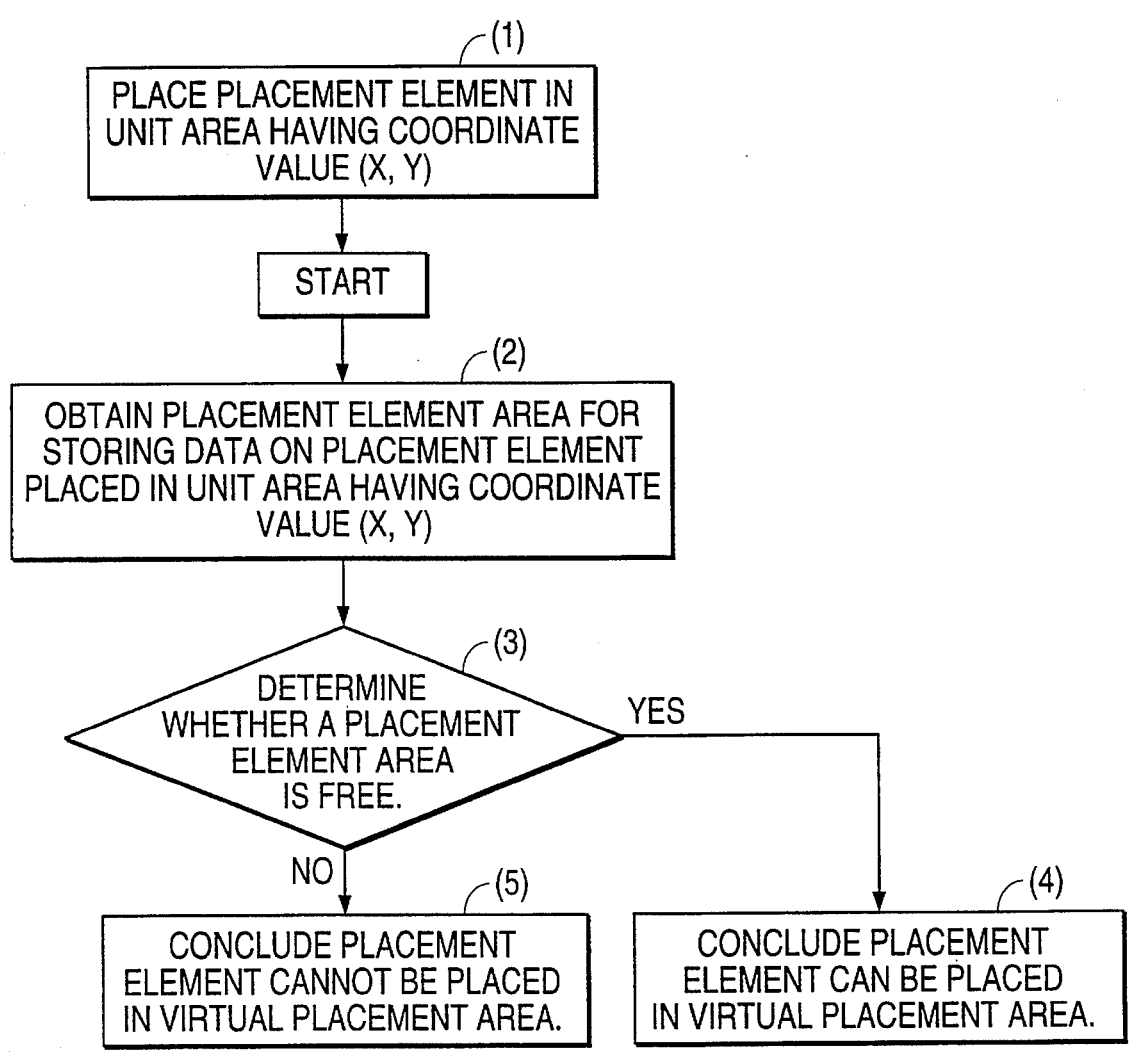
FIG. 15A shows an algorithm for checking the possibility of placing an element pursuant to this invention.

FIG. 15A shows an algorithm for checking the possibility of placing an element pursuant to this invention.

(1) A placement of a placement element in a unit area having a coordinate value (x, y) causes a start of the processes. [Assume here for a receipt of an instruction for placing placement element A in unit area 51-1 shown in FIG. 5.]

(2) A determination of a unit area enables a placement element area in a virtual placement area for storing data on the placement element placed in the unit area having coordinate value (x, y) to be determined. [Pointer storage unit 33 obtains the placement element A area 38' shown in FIG. 5.]

(3) It is determined whether or not a placement element area in a virtual placement area is free. Because a virtual placement area can store plural data in the placement element areas, it is examined how many data are written (or how many voids there are) in the placement element areas in the virtual placement area. [It is examined whether storage areas 38'-1 and 38'-2 in placement element A area 38' of the virtual placement area in intra-virtual-placement-area placement element (B) storage unit 38 are free, which are shown in FIG. 5.]

(4) In case of an affirmative determination result (YES) in (3), it is concluded that a placement element can be placed in a placement element area in the virtual placement area.

(5) In case of a negative determination result (NO) in (3), it is concluded that a placement element cannot be placed in a placement element area in the virtual placement area.

When a placement element is placed over a plurality of unit areas, it is examined whether each part of the placement element can be placed on its corresponding unit area. Only when all parts of the placement element can be placed on their corresponding unit areas, the placement element is allowed to be moved.

As described above, a placement element area can store plural data. Here, the number of plural data can be larger than the limit number for an actual placement. The reason is explained below by taking a cell movement as an example.

A plurality of cells cannot be stacked up at the same position. That is, a cell cannot be placed at a position for placing another cell. Although a small cell has little difficulty in finding free unit areas as its new position, a large cell has great difficulty in finding free unit areas as its new position, which makes it impractical to move a large cell from an initial position. Yet, if only small cells are moved without attempting to move large cells, the placement and routing obtained as an end product is dependent too much on the initial placement, which is not quite useful.

In such a case, a plurality of cells are placed virtually at a same position, which makes it easier for a large cell to move. The reason why this is called virtual is because a state in which cells are stacked up is impossible in an actual designing. However, this problem is solved, because cell overlaps are cleared finally after cells are moved repeatedly.

Figure 15B:
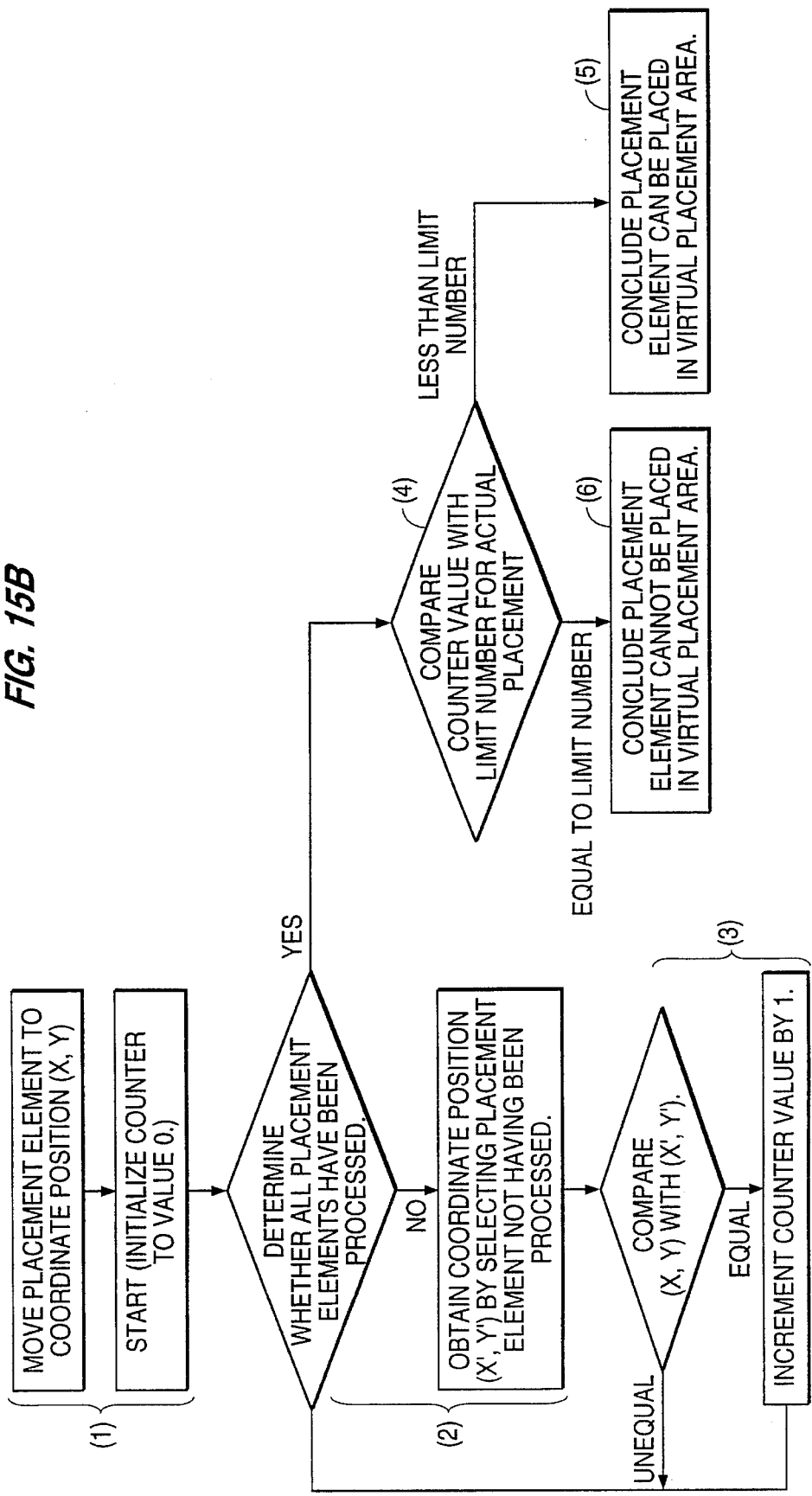
FIG. 15B shows an algorithm for checking the possibility of placing an element pursuant to a prior art.

FIG. 15B shows an algorithm for checking the possibility of placing an element pursuant to a prior art.

Its operations are explained by following the numbers below.

(1) A movement of a placement element to a coordinate position (x, y) causes a start of the processes.

(Initialize counter value to 0.)

(2) Determine whether all placement elements have been processed by extracting data on the coordinate position (x', y') on all placement elements (e.g., cells) except for a placement element to be moved.

(3) If a comparison of coordinate position (x, y) with coordinate position (x', y') indicates a match, a next placement element is processed by incrementing the counter value by one [1]. If a comparison of coordinate position (x, y) with coordinate position (x', y') indicates a mismatch, a next placement element is processed without incrementing the counter value by one [1].

(4) Upon completing comparisons with all cells, it is examined whether counter value is less than a limit number for an actual placement.

(5) It is concluded that the placement element can be placed in a virtual placement area, if the counter value is less than the limit number for an actual placement.

(6) It is concluded that the placement element cannot be placed in a virtual placement area, if the counter value is equal to the limit number for an actual placement.

As such the prior art takes too much time for processing, because in determining whether or not another placement element is already placed at a new position of a placement element, the positions of all placement elements need to be examined.

Figure 16A:
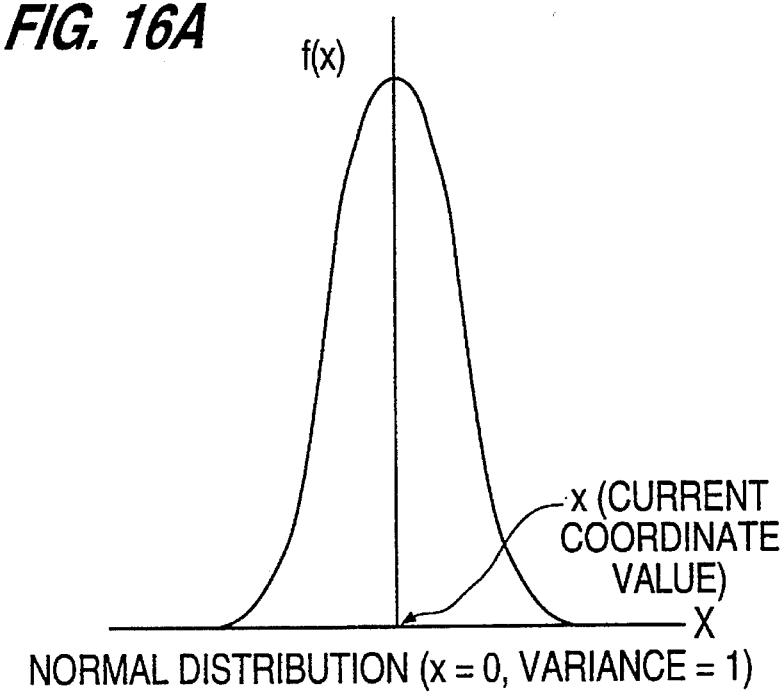
FIGS. 16A and 16B show shows an example of a probability distribution for creating a coordinate value.
Figure 16B:
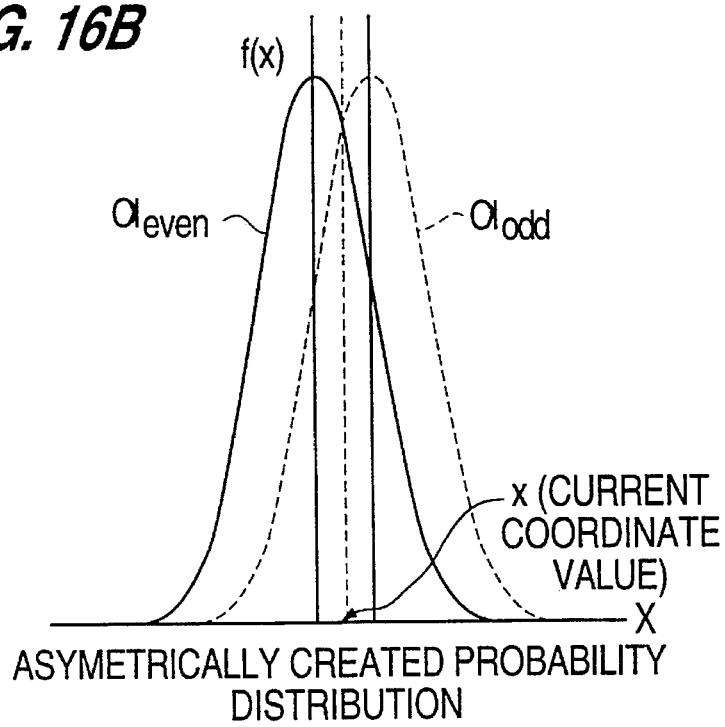

FIGS. 16A and 16B show an example of a probability distribution for creating coordinate values.

This invention employs a normal distribution as the probability of creating the changed coordinate position in which the mean is the current coordinate value with the variance being parametered, which is supplied, e.g., by a user through the placement data input unit 58 shown in FIG. 6.

For instance, a coordinate position (X, Y) is created using the following creation probability distributions, where Ux and Uy represent variances for the current coordinate position (x, y).

$$f(X)=(2\pi)^{-1/2}Ux^{-1}exp.[-(X-x)^2/2Ux^2]$$

$$f(Y)=(2\pi)^{-1/2}Uy^{-1}exp.[-(Y-y)^2/2Uy^2]$$

In the following description, the coordinate position is in BC units, with an integer ±0.5 being rounded to the integer.

FIG. 16A shows an example of a probability distribution for creating the X coordinate position in changing a placement according to this invention.

It shows a normal distribution, where the current coordinate position x is the mean and Ux is the variance. (x=0, variance=1)

That is, the above expression is rewritten as $$f(X)=(2\pi)^{-1/2}exp.(-X^2/2)$$

As a creation probability distribution creation, it is possible to create a probability distribution, for making it harder for a large cell to move, in which the mean of the X coordinate value is the current coordinate position x and the variance of the X coordinate value is Ux/s, and the mean of the Y coordinate value is the current coordinate position y and the variance of the Y coordinate value is Uy/s, where barometer s represents dimensions of a cell.

$$f(X)=(2\pi)^{-1/2}(Ux/s)^{-1}exp.[-(X-x)^2/2(Ux/s)^2]$$

$$f(Y)=(2\pi)^{-1/2}(Uy/s)^{-1}exp.[-(Y-y)^2/2(Uy/s)^2]$$

Because the larger the cell, the smaller the variances according to the above creation probability distributions, the cell gets more difficult to move, the larger it is.

Alternatively, to adjust the ease of a cell movement by dimensions s of a cell, which indicates whether a single cell is placed over a plurality of unit areas such as cell C shown in FIG. 8, the variances of the X coordinate value and the Y coordinate value may be $Ux/s^{1/2}$ and $Uy/s^{1/2}$ instead of Ux/s and Uy/s.

Also, when a gate array is placed as shown in FIG. 8A, a normal distribution may be created to make it easier to shift to the right when the current coordinate position is left (an odd X coordinate position) and to the left when the current coordinate position is right (an even X coordinate position) in the placement area of a gate array comprising two [2] columns.

An advantage of setting these normal distributions is explained in further detail by referring to FIG. 8A. Because a use of these setting methods allows the easier acceptance of a new coordinate position, because the new coordinate position is not likely to stay within the same set of two [2] columns (e.g., in columns 1 and 2) as the original. For instance, when cell X is at (3, 3), if (4, 3) is selected as the new coordinate position, since cell X remains in the same two [2] columns of a gate array, a new placement becomes easy. However, if (2, 3) is selected as the new coordinate position, since cell X is outside of the channel area, generally, the acceptance of the new coordinate position becomes less likely.

For instance, parametered by a positive real number $a_{odd}$ and a negative real number $a_{even}$, in case of being at an odd position as against a current coordinate position (x, y), the mean and variance in creating an X coordinate value are $x+a_{odd}$ and $Ux/s^{1/2}$ respectively, while similarly the mean and variance in creating a Y coordinate value are $y+a_{odd}$ and $Uy/s^{1/2}$, respectively where $a_{odd}>0$.

Also, in case of being at an even position as against a current coordinate position (x, y), the mean and variance in creating the X coordinate value are $x+a_{even}$ and $Ux/s^{1/2}$, respectively, while similarly the mean and variance in creating the Y coordinate value are $y+a_{even}$ and $Uy/s^{1/2}$, respectively where $a_{even}<0$.

FIG. 16B shows a normal probability distribution asymmetrical to the current position.

Other than the above examples, a cell having a larger past average moving distance may have a greater variance for its normal distribution, parametered by a cell history. The probability distribution creation unit 85 shown in FIG. 6 creates such a distribution.

Parametered by data on a nearby BC to which a placement is prohibited, a newly created coordinate value may be interpreted as a new X coordinate position by eliminating the BC to which a placement is prohibited. For instance, when there are two [2] consecutive BCs to which a placement is prohibited on the right side of the current coordinate position, if a new coordinate position having an X coordinate value greater than the current X coordinate value by 3 is created, then, the new coordinate value is greater than the current X coordinate value by 5.

In addition, a creation probability distribution can be altered in various ways by changing a normal distribution and a variance according to the dimensions of an integrated circuit, the number of cells in question, and a temperature and diverse energies for use in a simulated annealing method (to be described later in detail), such as by reducing the variance of a normal distribution.

Further, it is effective to stochastically create coordinate values after placements are outlined through a repetition of placement changes by initially creating a coordinate position at random, instead of creating a coordinate position according to the above probability distribution from the beginning.

Figure 17:
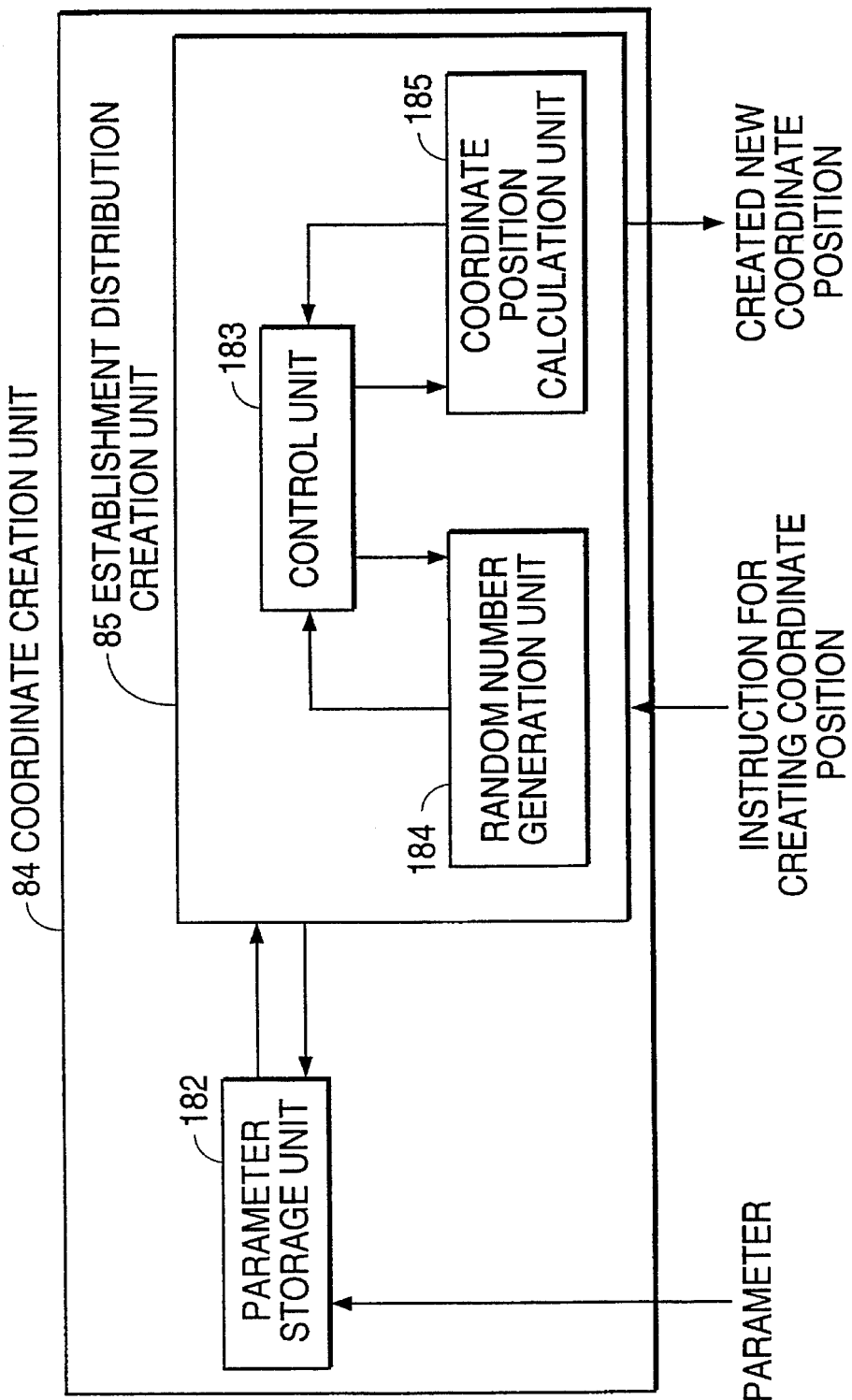
FIG. 17 shows in detail the structure of a coordinate position creation unit of this invention.

FIG. 17 shows in detail the structure of a coordinate position creation unit of this invention.

In FIG. 17:

182 is a parameter storage unit for storing an inputted parameter;

183 is a control unit;

184 is a random number generation unit; and

185 is a coordinate position calculation unit for creating a coordinate position based on a parameter and a random number.

Figure 18:
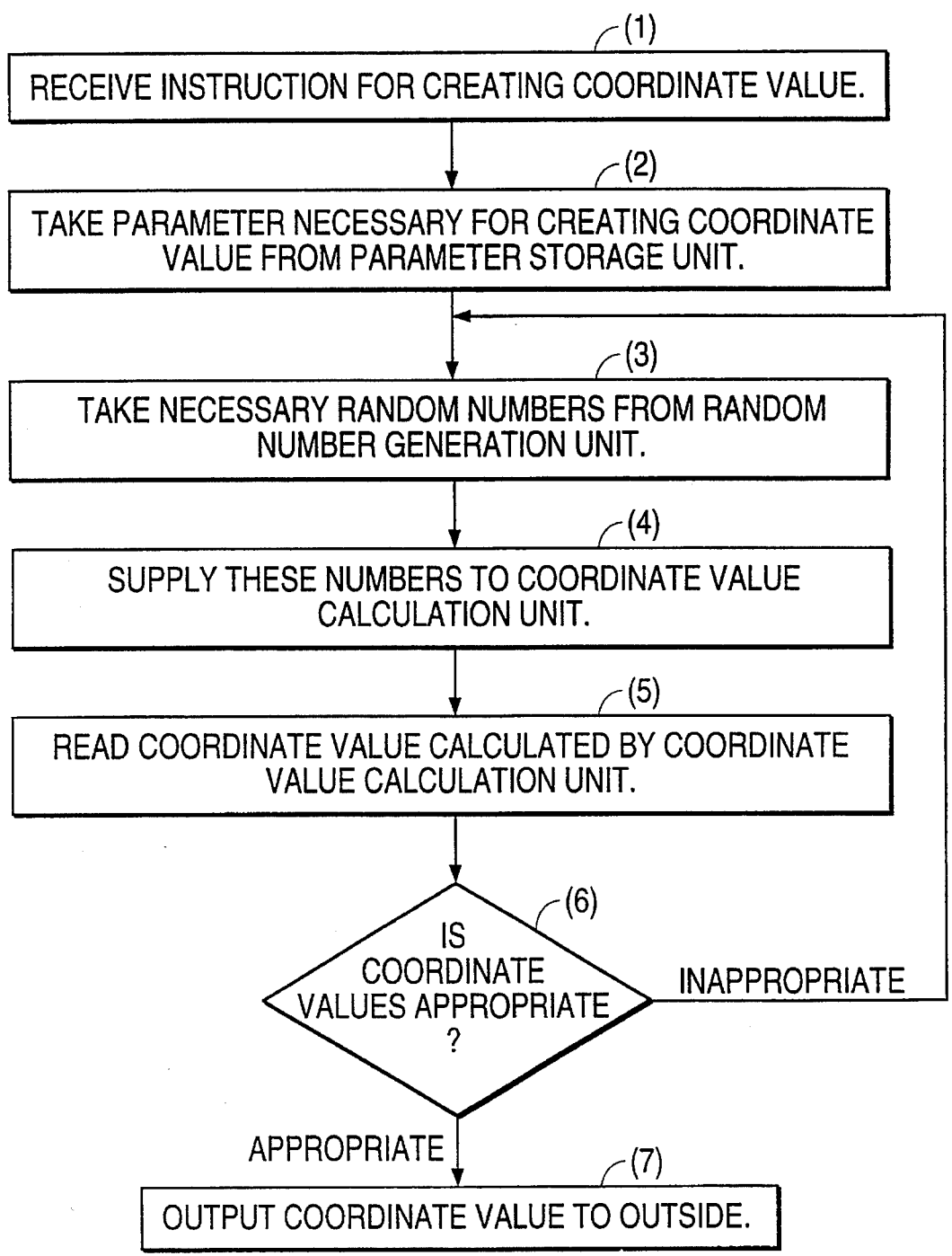
FIG. 18 shows an algorithm for a coordinate position creation unit of this invention.

FIG. 18 shows an algorithm for the coordinate position creation unit of this invention.

More specifically, FIG. 18 illustrates the operations under the configuration shown in FIG. 17.

The algorithm is explained according to the numbers (and by referring to FIG. 17 as necessary).

(1) A reception of an instruction for creating a coordinate value activates the coordinate value creation unit 84.

(2) The probability distribution creation unit 85 takes a parameter necessary for creating a coordinate value from the parameter storage unit 182. (More concretely, the control unit 183 takes from the parameter storage unit 182 a parameter necessary for creating a coordinate value and supplies it to the coordinate position calculation unit 185.)

(3) On receiving an instruction from the coordinate position calculation unit 185, the control unit 183 takes a necessary random number from the random number generation unit 184.

(4) The control unit 183 receives the necessary random number taken from the random number generation unit 184 and supplies the random number to the coordinate position calculation unit 185.

(5) The control unit 183 reads a coordinate value calculated by the coordinate position calculation unit 185.

(6) The control unit 183 determines whether the created coordinate value is appropriate or inappropriate. Return to (3) and repeat processes therefrom, in case of a negative determination result (NO). Proceed to (7) in case of an affirmative determination result (YES). The control unit 183 determines a case in which, for example, a created coordinate position is out of a printed circuit board to be inappropriate.

(7) The probability distribution creation unit 85 outputs the created coordinate value to the outside.

By repeating the processes from (1), the coordinate values are created for all cells.

Figure 19:
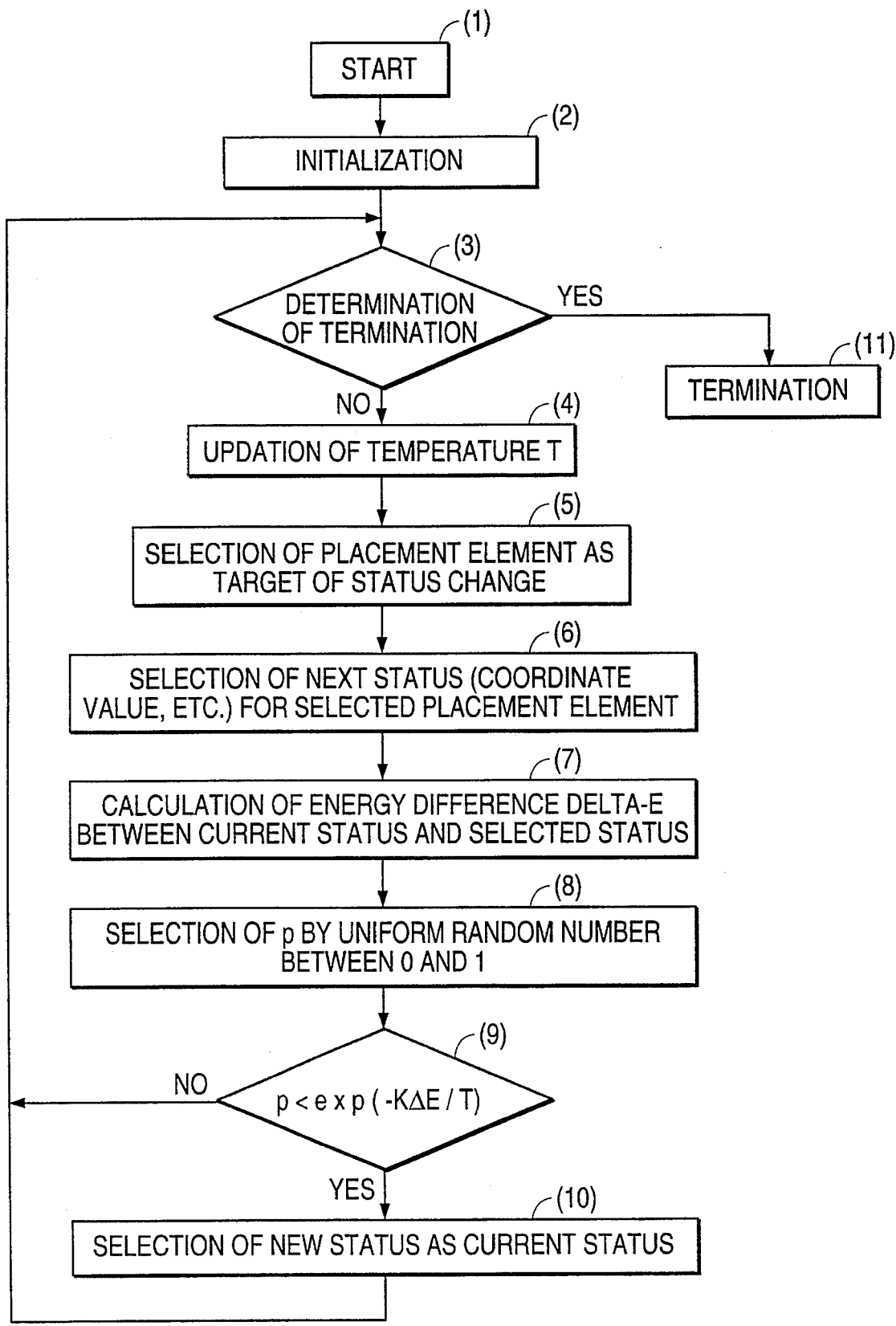
FIG. 19 shows an algorithm of a simulated annealing method with this invention applied.

FIG. 19 shows an algorithm of a simulated annealing method with this invention applied.

The simulated annealing method is for calculating an energy for a status in which a placement is made in consideration of the degree of redundancy of a cell and wire length. Through a comparison of the energy for the new status with that for the current status, an index, parametered by a temperature and determined by the set temperature and energy difference, is calculated as a benchmark for determining whether or not to change a placement. A randomly generated number for determining whether or not to adopt a new placement through a comparison with the index as the benchmark is selected. A comparison of the index with the selected number enables a selection between the adoption of the new placement and no change to the current placement. By varying the temperature, the processes are repeated, until no cell redundancy exists, or until the optimal placement minimizing energy through a reduction in the wire length is obtained.

The cell redundancy concept is explained below, which concept applies to a unit area. More specifically, the cell redundancy refers to a plurality of distinctive cells occupying a same unit area. In the example shown in FIG. 7, if three [3] cell areas correspond to a same unit area, of which two [2] record cell numbers 127 and 213, and the remaining one [1] records nothing, the cell redundancy of the unit area is 2. It must be noted here, however, that the cell redundancy used here is different from the degree-of-redundancy for an identical wire.

The algorithm is explained according to the numbers shown in FIG. 14.

(1) Processes start.

(2) Set a placement at an initialized placement status. (initialization) As an initialization, a data area as a virtual placement area and various parameters are set.

Figure 3:
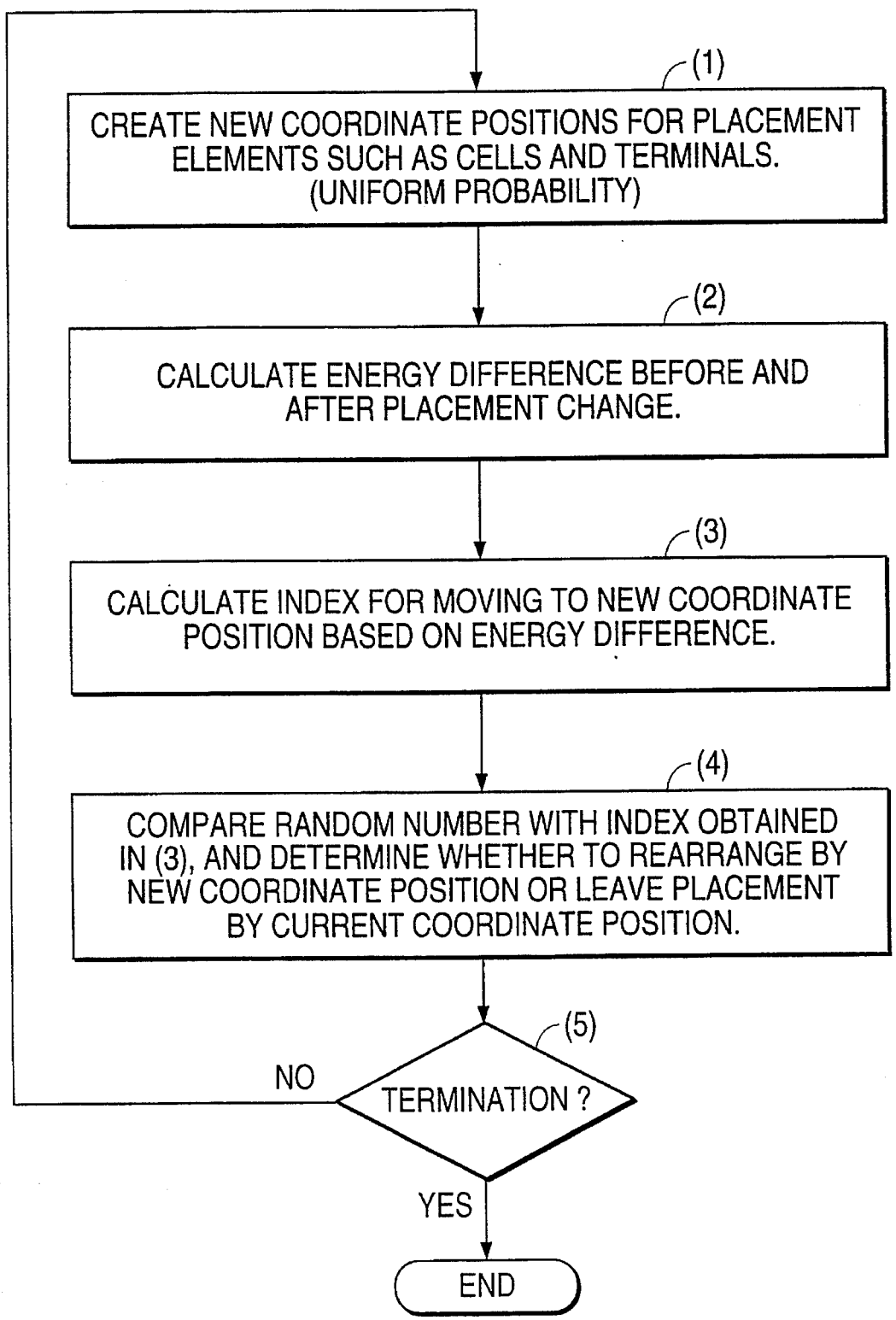
FIG. 3 shows a placement change method based on a conventional simulated annealing method.

(3) Determine whether to terminate. Unless terminating, proceed to (4). Proceed to (11) in case of a termination after an optimal placement is obtained and the process ends. A condition similar to that explained in (5) of FIG. 3 is used as a terminating condition.

(4) Update a temperature T. A user determines the updated width (i.e., an incremental change or a decremental change) of the temperature T, e.g., in accordance with an expression $T=T_0\alpha^k$, where $T_0$ is a initial temperature, $\alpha$ is a real number between 0 and 1, and $^k$ is the number of updates.

(5) Select a placement element as a target of a status change, e.g., sequentially for each type of a placement element.

(6) Select a next status (a coordinate value, etc.) for a selected placement element, thereby obtaining a candidate for a new placement.

(7) Calculate an energy difference delta-E between a current status and a selected status, similarly to (2) shown in FIG. 3. Based on delta-E, calculate a benchmark index $\exp(-K\ \text{delta-E}/T)$ for use in determining a change in a coordinate value.

(8) Select a numerical value p as a uniform random number between zero [0] and one [1].

(9) Determine whether a condition $p<\exp(-K\ \text{delta-E}/T)$ is satisfied. Upon satisfaction of this condition, proceed to (10). Repeat from (3) upon dissatisfaction of this condition.

(10) Adopt a new status, which is the candidate for a new placement, as a current status.

The condition (9) in the above algorithm represents a relation that when an energy difference delta-E (>0) between a current status and a selected status (a new status) is small at a temperature T, a random number p is more likely to satisfy the condition represented by (9) than when the energy difference delta-E is large. Also, it represents a relation that a new status is more likely to be selected, because a random number p, when the temperature T is high, is more likely to satisfy the condition represented by (9) than when the temperature T is low.

A simulated annealing method is for sequentially executing the above processes (one epoch) for respective cells, and repeats epochs until an optimal placement is obtained.

Further, this invention is applicable to other placement designs such as a placement design of a telephone exchange office, in addition to a case of obtaining the placement of a circuit element.

Additionally, this invention is applicable not only to a simulated annealing method but also to other algorithms such as a GA (genetic algorithm) method derived from a gene-based evolution model.

The GA method, for instance, expresses a placement status as an appropriate code (a string of symbols) by initially providing a plurality of codes, which are called genes. By causing a mutation (a random change of a symbol) and a partial exchange of two [2] genes, a new gene set is obtained. A better gene set is selected by applying a suitable objective function to gene members in the gene set. The best gene set is obtained finally by repeating the above procedure a number of times.

As described above in detail, because this invention causes data on a placement element such as a wire or a cell necessary for a placement/routing to be placed in a virtual placement area in correspondence with unit areas in a placement area, a placement can be changed more easily. Also, because data can be set in a large volume, this invention makes it possible to evaluate fine constraints dependent on a position and a shape necessary for a placement/routing.

Also, this invention can be quite easily applied to a system for designing on a parallel computer by making respective processor elements of a parallel computer system correspond with groups in unit areas.

Also, the method for changing a placement according to this invention can reduce the processing time necessary for obtaining an optimal placement, because a probability distribution for creating a coordinate value can be changed.

This invention can be used not only by a semiconductor industry designing an LSI but also by various other industries requiring a system for designing optimal placements of placement elements in predetermined areas.

What is claimed is:

1. A system for designing a placement of a placement element, for use in a placement designing system, comprising:

a placement element storage means for storing placement element data representing placement elements;

a placement/routing means for setting a placement of said placement element, said placement/routing means comprising, a placement area for placing said placement elements, said placement area including a unit area data storage means for storing unit area data representing unit areas, said unit areas split from said placement area, wherein a respective placement element is placed in each unit area, a plurality of intra-virtual-placement-area placement element position storage means, provided for each type of placement element for virtually storing placement element data in the virtual placement areas, a pointer storage means, for specifying placement element data stored in said intra-virtual-placement-area placement element position storage means to which said unit areas correspond, and a placement control means for setting the placement of placement elements in said placement area such that said placement elements whose placement element data are stored in said virtual placement areas are placed in respective unit areas in said unit area data storage means, according to the placement element data specified by said pointer storage means; and a placement output means for outputting the result of setting said placement.

2. The system for designing placement of a placement element according to claim 1, wherein:

said virtual placement areas comprise multiple layers of storage areas to store the same kinds of placement element data in numbers in excess of respective limit numbers, in correspondence with said unit areas.

3. The system for designing a placement of a placement element according to claim 1, wherein said unit area data storage means stores positions of unit areas split from said placement area and said unit areas comprise a plurality of gate array placement areas and channel areas between said gate array placement areas; and said plurality of gate array placement areas comprise unit areas corresponding to the dimensions of basic cells, which form units of cells in gate arrays.

4. The system for designing a placement of a placement element according to claim 1, wherein:

one of said plurality of intra-virtual-placement-area placement element position storage means comprises a degree-of-redundancy storage area for storing a degree of redundancy of placement elements placed in the same unit area in said placement area; and said placement control means comprises, a unit area dam creation means for splitting said placement area into unit areas and for storing the split placement area in the unit area data storage means;

a pointer creation means for creating pointers corresponding to said unit area and for storing said pointers in said pointer storage means;

a plurality of placement element creation means respectively corresponding to said plurality of intra-virtual-placement-area placement element position storage means, for creating placement element data including positions of said placement elements in said placement area;

a degree-of-redundancy determination means, including a degree-of-redundancy storage area, for determining the degrees of redundancy of placement elements whose placement element data are newly created by using an output from one of said plurality of placement element creation means corresponding to said one, of said plurality of intra-virtual-placement-area placement element position storage means and the storage content of said degree-of-redundancy storage area;

a placement data creation means for creating placement data representing a placement of placement elements in said unit areas in said placement area, by using the storage contents of said unit area data storage means and said plurality of intra-virtual-placement-area placement element position storage means, and for outputting said placement data to said placement output means;

a placement change necessity determination means for determining whether a change in a placement of placement elements in said placement area is necessary or not by using placement data created by said placement data creation means;

a probability distribution creation means for creating a probability distribution for creating new coordinate values, which become the bases for creating new placement data based on an adopted placement, after said placement change necessity determination means has determined the necessity for a placement change; and a coordinate position creation means for creating a new coordinate position for a placement by using said probability distribution created by said probability distribution creation means and for outputting the result of creating said new coordinate position to said unit area data creation means, said pointer creation means and said plurality of placement element creation means.

5. The system for designing a placement of a placement element according to claim 4, wherein:

said placement element storage means comprises a placement element file for storing cell data including a name and dimensions of a cell, terminal data including a name and type of a terminal, wire data including a wire width and via hole data representing a via hole;

said plurality of intra-virtual-placement-area placement element position storage means corresponding to said plural types of placement elements each comprising a cell placement storage means, a terminal placement storage means, a via hole placement storage means and a wire placement storage means having a degree-of-redundancy storage area; and said plurality of placement element creation means each comprising a cell placement creation means for outputting cell placement data to said cell placement storage means, a terminal placement creation means for outputting terminal placement data to said terminal placement storage means, a via hole placement creation means for outputting via hole placement data to said via hole placement storage means, and a wire placement creation means for outputting wire data to said wire placement storage means and said degree-of-redundancy determination means.

6. The system for designing a placement of a placement element according to claim 5, wherein:

unit areas, whose positions are stored in said unit area data storage means, comprise unit areas each for placing one of a cell and a wire, and a unit area for placing one of a wire, a terminal and a via hole; and pointers stored in said pointer storage means comprise, a pointer for specifying a first layer in plural layers of wire areas each for storing wire data representing a wire, stored in said wire placement storage means, to be placed in said unit area, a pointer for specifying a first layer in plural layers of cell areas for storing data representing a cell, stored in said cell placement storage means, to be placed in said unit area, a pointer for specifying a first layer in plural layers of terminal areas for storing terminal data representing a terminal, stored in said terminal placement storage means, to be placed in said unit area, and a pointer for specifying a via hole area for storing via hole data representing a via hole, stored in said via hole placement storage means, to be placed in said unit area.

7. The system for designing a placement of a placement element according to claim 5, wherein:

said cell placement storage means stores data representing respective parts of a single cell placed over a plurality of unit areas in said placement area, in a single one of plural layers of cell areas corresponding respectively to said unit areas.

8. The system for designing a placement of a placement element according to claim 5, wherein:

said cell placement storage means stores data representing respective parts of a single cell placed over a plurality of unit areas in said placement area, in different layers of plural layers of cell areas corresponding respectively to said unit areas.

9. The system for designing a placement of a placement element according to claim 5, wherein:

said degree-of-redundancy storage area store, as degrees of redundancy, respective numbers of identical wires placed in the same unit areas in correspondence with plural layers of a wire area in said wire placement storage means.

10. The system for designing a placement of a placement element according to claim 5, wherein:

said unit area data stored in said unit area data storage means comprises unit area numbers of respective unit areas split from said placement area, unit area data including the types of placement elements incapable of being placed in said unit area, and pointers for specifying a pointer storage position to intra-virtual-placement-area data representing a placement element to be placed in said unit area in said pointer storage means;

said pointer data stored in said pointer storage means comprises said pointers to a cell area, a wire area, a terminal area and a via hole area, respectively, in correspondence with said unit areas;

said cell placement data stored in said cell placement storage means comprises cell area data including the cell area numbers and unit area positions for placing cells, for respective cell areas in plural layers; and said wire placement data stored in said wire placement storage means comprises wire area data including degrees of redundancies of wires and the cell numbers of cells for placing said wires, for respective wire areas in plural layers.

11. The system for designing a placement of a placement element according to claim 5, wherein said cell placement creation means comprises:

a first means for determining whether or not cell placement processes for all parts of a single cell placed over a plurality of unit areas have been completed;

a second means, invoked when said first means determines cell placement processes have not been completed, for selecting one of said parts in said single cell not having been processed yet;

a third means for obtaining a unit area corresponding to said part selected in said second means from the position for placing said part of said single cell and the relative position of said selected part in said single cell;

a fourth means for placing said selected part in said unit area;

a fifth means for determining whether or not the result of placing said selected part in said unit area by said fourth means is successful and returning to said first means when it is determined that placing said selected part in said unit area is successful;

a sixth means, invoked when said fifth means determines that placing said selected part in said unit area is not successful, for outputting a result indicating a failure to the outside;

a seventh means, invoked when said first means determines cell placement processes have been completed, for terminating a cell placement process.

12. The system for designing a placement of a placement element according to claim 5, wherein said cell placement creation means, said terminal placement creation means, and said via hole placement creation means respectively comprise:

a first means for receiving an instruction for changing a placement of a corresponding placement element;

a second means for determining whether said instruction is for a placement or an elimination of a placement element;

a third means, invoked when said second means determines said instruction is for a placement of a placement element, for determining whether or not a unit area desired for placing said placement element is free;

a fourth means, invoked when said third means determines a unit area desired for placing said placement element is free, for recording necessary data in a free area;

a fifth means, invoked when said third means determines a unit area desired for placing said placement element is not free, for outputting the result to the outside, if no free area is available;

a sixth means, invoked when said second means determines said instruction is for an elimination, for determining whether or not a placement element matches one instructed for an elimination from a unit area of said placement element;

a seventh means, invoked when said sixth means determines a placement element matches one instructed for an elimination from a unit area, for deleting data from unit areas of said placement element; and an eighth means, invoked when said sixth means determines a placement element does not match one instructed for an elimination from a unit area, for outputting a message informing of a mismatch with an instructed placement element to the outside.

13. The system for designing a placement of a placement element according to claim 5, wherein said wire placement creation means comprises:

a first means for receiving an instruction for changing a placement of a wire;

a second means for determining whether an instruction is for a placement or an elimination of a wire;

a third means, invoked when said second means determines said instruction is for a placement of a wire, for determining whether a unit area desired for placing said wire has one matching said wire;

a fourth means, invoked when said third means determines a unit area for placing said wire does not have one matching wire, for determining whether or not a unit area desired for placing the placement element has a free area;

a fifth means, invoked when said fourth means determines said unit area desired for placing the placement element has a free area, for recording necessary data in a free unit area, and writing one as a degree of redundancy in the corresponding virtual area;

a sixth means, invoked when said fourth means determines said unit area desired for placing the placement element does not have a free area, for outputting the result to the outside;

a seventh means, invoked when said third means determines a trait area for placing said wire has one matching wire, for incrementing the degree of redundancy of said wire in said unit area by one;

an eighth means, invoked when said second means determines said instruction is for an elimination of a placement element, for determining whether or not a wire matches one instructed for elimination from a unit area;

a ninth means, invoked when said eighth means determines a wire matched one instructed for elimination from a unit area, for determining whether or not the degree of redundancy in the area corresponding to the placement element is one;

a tenth means, invoked when said ninth means determines that the degree of redundancy on the area corresponding to the placement element is one, for setting the degree of redundancy to zero and deleting associated data in said virtual placement area simultaneously;

an eleventh means, invoked when said ninth means determines that the degree of redundancy in the area corresponding to the placement element is not one, for decrementing, by one, the degrees of redundancy not being one; and a twelfth means, invoked when said eighth means determines a wire does not match one instructed for elimination from a unit area, for outputting to the outside that no wire matches one instructed for elimination from a unit area.

14. The system for designing a placement of a placement element according to claim 5, wherein:

said cell placement creation means for checking a cell placement possibility, said terminal placement creation means for checking a terminal placement possibility, said via hole placement creation means for checking a via hole placement possibility and said wire placement creation means for checking a wire placement possibility respectively comprise:

a first means for receiving an instruction for placing a placement element in a unit area whose position is specified by a coordinate value (x, y);

a second means for obtaining a virtual placement area storing placement element data of a placement element to be placed in said unit area specified by said coordinate value;

a third means for determining whether or not said virtual placement area has a void;

a fourth means, invoked when said third means determines said virtual placement area has a void, for determining that said placement element can be placed; and a fifth means, invoked when said third means determines said virtual placement area does not have a void, for determining that said placement element cannot be placed.

15. The system for designing a placement of a placement element according to claim 4, further comprising:

a placement dam input means for inputting placement data, including wire data of a circuit, to said placement control means and for inputting a parameter, including a constant for creating a probability distribution, to a probability distribution creation means in said placement control means.

16. The system for designing a placement of a placement element according to claim 15, wherein:

said probability distribution creation means creates probability distributions for creating a new coordinate value (X, Y) according to normal distributions having means equal to a current coordinate value (x, y) by using variances Ux and Uy supplied as parts of parameters from said placement data input means $$f(X)=(2\pi)^{-\frac{1}{2}}U_x^{-1}exp.[-(X-x)^2/2U_x^2]$$

$$f(Y)=(2\pi)^{-\frac{1}{2}}Uy^{-1}exp.[-(Y-y)^2/2Uy^2]$$

and said coordinate value creation means creates a new coordinate position according to said probability distributions.

17. The system for designing a placement of a placement element according to claim 15, wherein:

said probability distribution creation means creates probability distributions for creating a new coordinate value (X, Y) according to normal distributions having means equal to a current coordinate value (x, y) by using variances Ux and Uy supplied as parts of parameters from said placement data input means and s as dimensions of a single cell defined by the number of unit areas over which said single cell is placed, $$f(X)=(2\pi)^{-\frac{1}{2}}(Ux/s)^{-1}exp.[-(X-x)^2/2(Ux/s)^2]$$

$$f(Y)=(2\pi)^{-\frac{1}{2}}(Uy/s)^{-1}exp.[-(Y-y)^2/2\,(Uy/s)^2]$$

and said coordinate position creation means creates a new coordinate position according to said probability distributions.

18. The system for designing a placement of a placement element according to claim 15, wherein:

said probability distribution creation means creates, by using a current coordinate value (x, y), a positive real number $a_{odd}$ and a negative real number $a_{even}$, a first set of probability distributions having means $X+a_{odd}$ and $y+a_{odd}$ and a second set of probability distributions having means $x+a_{even}$ and $y+a_{even}$; and said coordinate position creation means creates a new coordinate position based on a current coordinate value (x, y) by using either one [1] of said first set of probability distributions and said second set of probability distributions.

19. The system for designing a placement of a placement element according to claim 15, wherein:

said probability distribution creation means comprises a random number generation means for generating a random number, a coordinate position calculation means for calculating a coordinate value, a control means for controlling said random number generation means and said coordinate position calculation means; and said coordinate position creation means further comprises a parameter storage means for storing a parameter inputted from said parameter data input means.

20. The system for designing a placement of a placement element according to claim 19, wherein:

said coordinate position creation means receives an instruction for creating a coordinate position in a coordinate position creation process;

said control means receives a random number generated by said random number generation means;

said control means supplies said received random number to said coordinate position calculation means;

said control means reads the coordinate value calculated by said coordinate position calculation means;

said control means determines whether said read coordinate value is appropriate or inappropriate; and said control means outputs a coordinate value determined to be appropriate, otherwise repeats its processes by receiving a random number generated by said random number generation means.

* * * * *

UNITED STATES PATENT AND TRADEMARK OFFICE
CERTIFICATE OF CORRECTION

PATENT NO. : 5,475,608
DATED : December 12, 1995
INVENTOR(S) : Ryusuke MASUOKA et al.

It is certified that error appears in the above-indentified patent and that said Letters Patent is hereby corrected as shown below:

Column 12, line 64, delete "in".

Column 17, line 1, delete "in".

Column 24, line 27, delete "dam" and insert --data--.

Column 27, line 62, delete "trait" and insert --unit--.

Signed and Sealed this

Sixteenth Day of April, 1996

Attest:

BRUCE LEHMAN

Attesting Officer

Commissioner of Patents and Trademarks